(12) United States Patent
Masui et al.

(10) Patent No.: US 7,871,841 B2
(45) Date of Patent: Jan. 18, 2011

(54) METHOD FOR MANUFACTURING SEMICONDUCTOR LIGHT-EMITTING DEVICE

(75) Inventors: Yuji Masui, Kanagawa (JP); Takahiro Arakida, Kanagawa (JP); Yoshinori Yamauchi, Tokyo (JP); Rintaro Koda, Tokyo (JP); Tomoyuki Oki, Miyagi (JP)

(73) Assignee: Sony Corporation, Tokyo (JP)

( * ) Notice: Subject to any disclaimer, the term of this patent is extended or adjusted under 35 U.S.C. 154(b) by 79 days.

(21) Appl. No.: 12/285,267

(22) Filed: Oct. 1, 2008

(65) Prior Publication Data

US 2009/0098675 A1    Apr. 16, 2009

(30) Foreign Application Priority Data

Oct. 15, 2007    (JP)    ............................. 2007-267871

(51) Int. Cl.
*H01L 21/00* (2006.01)
*H01S 5/22* (2006.01)

(52) U.S. Cl. .................. 438/39; 438/42; 372/46.013

(58) Field of Classification Search ............. 438/22, 438/39, 42; 372/43.01, 46.013
See application file for complete search history.

(56) References Cited

U.S. PATENT DOCUMENTS

| | | | | | |
|---|---|---|---|---|---|
| 5,719,891 | A | * | 2/1998 | Jewell | 372/46.013 |
| 5,897,329 | A | * | 4/1999 | Jewell | 438/38 |
| 6,014,395 | A | * | 1/2000 | Jewell | 372/45.01 |
| 6,269,109 | B1 | * | 7/2001 | Jewell | 372/50.1 |
| 6,320,893 | B1 | * | 11/2001 | Ueki | 372/96 |
| 6,563,137 | B2 | * | 5/2003 | Uchida | 257/84 |
| 6,639,927 | B2 | * | 10/2003 | Sato et al. | 372/46.013 |
| 6,678,307 | B2 | * | 1/2004 | Ezaki et al. | 372/96 |
| 6,765,943 | B2 | * | 7/2004 | Jewell | 372/46.013 |
| 6,804,279 | B2 | * | 10/2004 | Furukawa | 372/43.01 |
| 6,990,128 | B2 | * | 1/2006 | Koyama et al. | 372/18 |
| 7,020,173 | B2 | * | 3/2006 | Yamamoto et al. | 372/45.01 |
| 7,068,696 | B2 | * | 6/2006 | Ezaki et al. | 372/46.01 |
| 7,244,629 | B2 | * | 7/2007 | Ezaki et al. | 438/39 |
| 7,330,494 | B1 | * | 2/2008 | Jewell | 372/50.124 |
| 2001/0006528 | A1 | * | 7/2001 | Sato et al. | 372/46 |
| 2001/0032984 | A1 | * | 10/2001 | Uchida | 257/84 |

(Continued)

FOREIGN PATENT DOCUMENTS

JP    2003-158340    5/2003

(Continued)

*Primary Examiner*—Mary Wilczewski
(74) *Attorney, Agent, or Firm*—Rader, Fishman & Grauer PLLC

(57) ABSTRACT

A method of manufacturing a semiconductor light-emitting device includes steps of forming a vertical cavity structure including a layer to be oxidized on a semiconductor substrate, and then forming a circular groove having a depth which penetrates at least the layer to be oxidized from an upper surface of the vertical cavity structure, thereby forming a columnar mesa whose side face is surrounded by the groove, oxidizing the layer to be oxidized from the side face of the mesa, thereby forming a current confinement layer, and forming a mask layer covering at least a central region of the upper surface of the mesa and exposing at least an edge of the upper surface and the side face of the mesa to an external, and then etching at least the edge of the upper surface and the side face of the mesa by using the mask layer as a mask.

13 Claims, 18 Drawing Sheets

U.S. PATENT DOCUMENTS

| | | | |
|---|---|---|---|
| 2002/0134987 A1* | 9/2002 | Takaoka | 257/98 |
| 2002/0141472 A1* | 10/2002 | Koyama et al. | 372/96 |
| 2002/0186735 A1* | 12/2002 | Jewell | 372/46 |
| 2003/0039294 A1* | 2/2003 | Ueki et al. | 372/96 |
| 2003/0063649 A1* | 4/2003 | Ezaki et al. | 372/96 |
| 2003/0169795 A1* | 9/2003 | Otoma et al. | 372/46 |
| 2004/0046180 A1* | 3/2004 | Takaoka | 257/98 |
| 2004/0066284 A1* | 4/2004 | Hastings, Sr. | 340/425.5 |
| 2004/0151221 A1* | 8/2004 | Yamamoto et al. | 372/32 |
| 2004/0165636 A1* | 8/2004 | Ezaki et al. | 372/46 |
| 2005/0013334 A1* | 1/2005 | Watanabe et al. | 372/44 |
| 2005/0092710 A1* | 5/2005 | Biard et al. | 216/13 |
| 2006/0056473 A1* | 3/2006 | Tanigawa et al. | 372/43.01 |
| 2006/0187997 A1* | 8/2006 | Ezaki et al. | 372/99 |
| 2007/0014324 A1* | 1/2007 | Maeda et al. | 372/46.01 |
| 2007/0153865 A1* | 7/2007 | Maeda et al. | 372/50.124 |
| 2008/0232414 A1* | 9/2008 | Masui et al. | 372/44.01 |
| 2008/0240194 A1* | 10/2008 | Maeda et al. | 372/50.1 |
| 2009/0032908 A1* | 2/2009 | Masui et al. | 257/623 |
| 2009/0052490 A1* | 2/2009 | Maeda et al. | 372/50.11 |
| 2009/0098675 A1* | 4/2009 | Masui et al. | 438/39 |
| 2009/0180506 A1* | 7/2009 | Maeda et al. | 372/44.01 |
| 2009/0310637 A1* | 12/2009 | Kageyama et al. | 372/43.01 |
| 2010/0040104 A1* | 2/2010 | Maeda et al. | 372/50.124 |
| 2010/0046565 A1* | 2/2010 | Masui et al. | 372/45.01 |

FOREIGN PATENT DOCUMENTS

| | | |
|---|---|---|
| JP | 2004-179640 | 6/2004 |

* cited by examiner

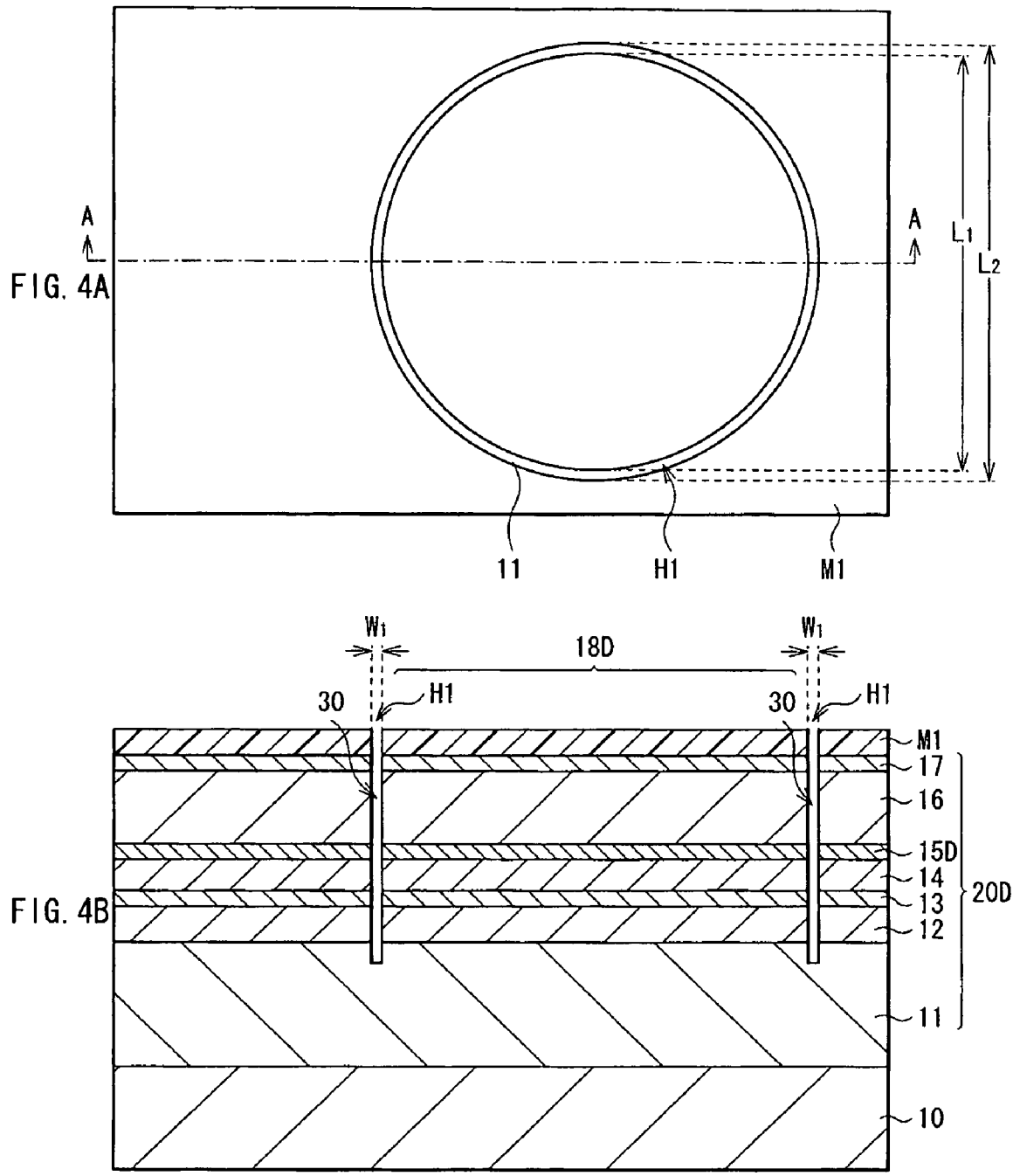

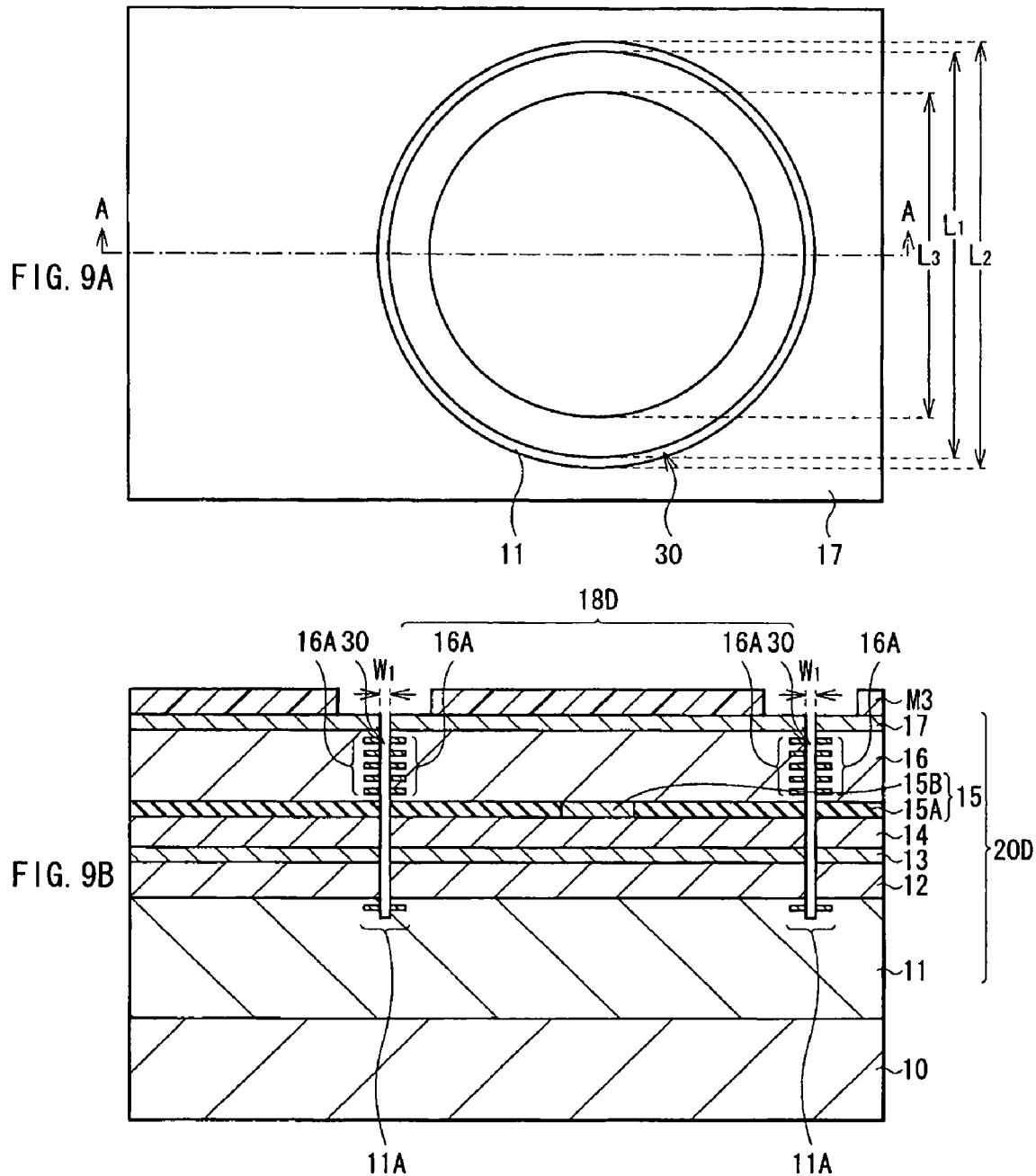

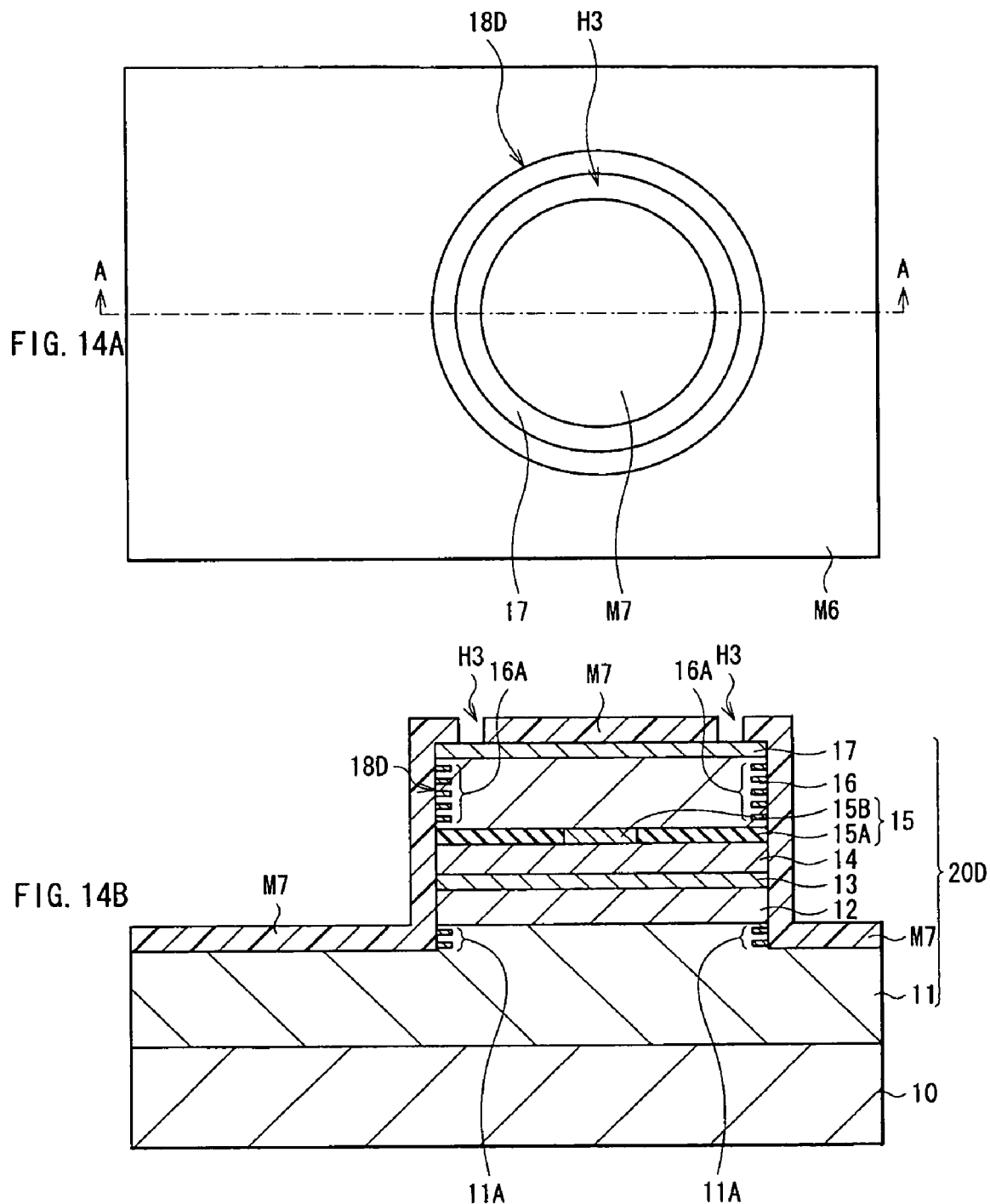

METHOD FOR MANUFACTURING SEMICONDUCTOR LIGHT-EMITTING DEVICE

CROSS REFERENCES TO RELATED APPLICATIONS

The present invention contains subject matter related to Japanese Patent Application JP 2007-267871 filed in the Japanese Patent Office on Oct. 15, 2007, the entire contents of which being incorporated herein by reference.

BACKGROUND OF THE INVENTION

1. Field of the Invention

The present invention relates to a method of manufacturing a semiconductor light-emitting device including a vertical cavity structure.

2. Description of the Related Art

A surface-emitting laser diode differs from an edge-emitting laser diode of the related art in that the surface-emitting laser diode emits a light in a direction orthogonal to a substrate, and allows multiple devices to be arranged in a two-dimensional array on the same substrate. Thus, the surface-emitting laser diode has attracted attention in recent years as a light source used for a digital copying machine and a printer.

As shown in FIG. 16, for example, this type of surface-emitting laser diode includes a vertical cavity structure by stacking, on a substrate 110, a lower DBR layer 111, a lower spacer layer 112, an active layer 113, an upper spacer layer 114, a current confinement layer 115, an upper DBR layer 116, and a contact layer 117 in this order from the substrate 110 side. A columnar mesa 118 is formed in an upper part of the vertical cavity structure, specifically, in a part of the lower DBR layer 111, the lower spacer layer 112, the active layer 113, the upper spacer layer 114, the current confinement layer 115, the upper DBR layer 116, and the contact layer 117. An upper electrode 121 is formed on an upper surface of the mesa 118, and a lower electrode 122 is formed on a rear surface of the substrate 110. In addition, FIG. 16 illustrates an example of a cross sectional configuration of a surface-emitting laser diode 100 of the related art.

The mesa 118 is, for example, formed as will be described below. First, the vertical cavity structure is formed by stacking the lower DBR layer 111, the lower spacer layer 112, the active layer 113, the upper spacer layer 114, a layer to be oxidized 115D, the upper DBR layer 116, and the contact layer 117 in this order on the substrate 110. Then, a circular mask layer M10 is formed on the upper surface of the contact layer 117 (FIG. 17). In addition, the layer to be oxidized 115D will become the current confinement layer 115 through an oxidation process, which will be described later.

Next, by a dry etching method, the upper part of the vertical cavity structure is selectively etched while using the mask layer M10 as a mask, thereby forming the columnar mesa 118D. The layer to be oxidized 115D is selectively oxidized from the side face of the mesa 118D, for example, by a high-temperature oxidation treatment in a water-vapor atmosphere (FIG. 18). Therefore, in the layer to be oxidized 115D, a region from the side surface to a predetermined depth becomes an oxidation region (insulating region), which serves as a current confinement region 115A, and a region further deep from the oxidation region becomes a non-oxidation region, which serves as a current injection region 115B. In this manner, the current confinement layer 115 composed of the current confinement region 115A and the current injection region 115B is formed.

Typically, the layer to be oxidized 115D is made of a material, which is most easily oxidized in the vertical cavity structure, such as AlGaAs with high Al composition ratio. However, each of the lower DBR layer 111 and the upper DBR layer 116 included in the vertical cavity structure generally has a stacked structure by alternately stacking a low refractive index layer with relatively high Al composition ratio and a high refractive index layer with relatively low Al composition ratio. The low refractive index layer included in each of the lower DBR layer 111 and the upper DBR layer 116 is oxidized with relative ease. That means, in the vertical cavity structure, there are still other layers except the layer to be oxidized 115D, which are easily oxidized. This causes that the layers which are oxidized with relative ease, such as the low refractive index layer included in each of the lower DBR layer 111 and the upper DBR layer 116, are also oxidized in the case of the excessive oxidation in the oxidation process for the layer to be oxidized 115D (refer to oxidation portions 111A and 116A in FIG. 18). As a result, in not only the current confinement layer 115 but also other layers except the current confinement layer 115 in the vertical cavity structure, there is a risk that deformation caused by volume shrinkage during the oxidation occurs and thus mechanical destruction is produced. Further, various impurities such as oxygen are included in an interface (an oxidation front) between the oxidation region and the non-oxidation region so that the oxidation front is in an unstable state. For this reason, damage starting from the oxidation front may grow with time, and there is a risk that a device lifetime decreases since the other layers except the layer to be oxidized 115D in the vertical cavity structure are also oxidized.

In order to solve this issue, for example, in Japanese Unexamined Patent Publication No. 2004-179640, proposed is a method in which an In-containing layer (InAlGaAs) with a lattice constant larger than those of surrounding layers is provided adjacently to a current confinement layer so that the deformation caused by the volume shrinkage during the oxidation is compensated. For example, in Japanese Unexamined Patent Publication No. 2003-158340, proposed is a method in which an oxidation confinement diameter of a current confinement layer is set larger than a certain level so that stress applied on the active layer due to the deformation caused by the volume shrinkage during the oxidation is suppressed.

SUMMARY OF THE INVENTION

However, in Japanese Unexamined Patent Publication No. 2004-179640, other measures are necessary for suppressing light absorption of the In-containing layer itself and avoiding degradation of reliability. In Japanese Unexamined Patent Publication No. 2003-158340, there are issues that a threshold current and power consumption increase, a direct-modulation bandwidth decreases, and the like. Further, in Japanese Unexamined Patent Publication Nos. 2004-179640 and 2003-158340, the growth of the damage starting from the oxidation front may not be suppressed and the deformation caused by the volume shrinkage during the oxidation in the layers other than the current confinement layer 115 in the vertical cavity structure may not be suppressed either.

In the case where the layers other than the layer to be oxidized in the vertical cavity structure are oxidized, measures may be taken afterwards so as to suppress the damage growth and the deformation in the layers other than the current confinement layer in the vertical cavity structure. Specifically, for example as shown in FIG. 19, a circular mask layer M11 is formed on a central region (a region except the oxidation portions 111A and 116A on the upper surface of the mesa 118) of the upper surface of the mesa 118, and then an edge of the mesa 118 is selectively etched while using the mask layer M11 as a mask, thereby removing the oxidation portions 111A and 116A.

In this case, there is an issue that the surrounding region (the lower DBR layer 111) of the mesa 118 in the vertical cavity structure is also etched. Thus, the mesa 118 becomes higher than necessary, and this makes succeeding steps complicated.

In view of the foregoing, it is desirable to provide a method of manufacturing a semiconductor light-emitting device having a mesa with a height no higher than necessary, and capable of suppressing a growth of damage starting from an oxidation front and deformation caused by a volume shrinkage during oxidation in layers except a current confinement layer in a vertical cavity structure.

According to an embodiment of the present invention, there is provided a first method of manufacturing a semiconductor light-emitting device, which includes steps of (A1), (A2), and (A3) as follows:

(A1) forming a vertical cavity structure including a layer to be oxidized on a semiconductor substrate, and then forming a circular groove having a depth which penetrates at least the layer to be oxidized from an upper surface of the vertical cavity structure, thereby forming a columnar mesa whose side face is surrounded by the groove;

(A2) oxidizing the layer to be oxidized from the side face of the mesa, thereby forming a current confinement layer; and (A3) forming a mask layer covering at least a central region of the upper surface of the mesa and exposing at least an edge of the upper surface and the side face of the mesa to an external, and then etching at least the edge of the upper surface and the side face of the mesa by using the mask layer as a mask.

In the first method of manufacturing the semiconductor light-emitting device according to an embodiment of the present invention, a mask layer covering at least the central region of the upper surface of the mesa and exposing at least the edge of the upper surface and the side face of the mesa to an external is formed on the columnar mesa whose side face is surrounded by the groove. Then, at least the edge of the upper surface and the side face of the mesa are etched by using the mask layer as a mask. Thereby, without largely changing a height of the mesa from its original height, the edge of the upper surface and the side face of the mesa, that is, a region including a portion oxidized from the side face in the layers except the current confinement layer in the vertical cavity structure may be removed.

According to an embodiment of the present invention, there is provided a second method of manufacturing a semiconductor light-emitting device, which includes steps of (B1), (B2), and (B3) as follows:

(B1) forming a vertical cavity structure including a layer to be oxidized on a semiconductor substrate, and then selectively etching from an upper surface of the vertical cavity structure to at least the layer to be oxidized, thereby forming a columnar mesa having a side face to which the layer to be oxidized is exposed;

(B2) oxidizing the layer to be oxidized from the side face of the mesa, thereby forming a current confinement layer; and (B3) forming a mask layer having an aperture corresponding to an edge of the upper surface and the side face of the mesa, or a vicinity of the edge of the upper surface of the mesa, and then selectively etching the edge of the upper surface and the side face of the mesa via the aperture.

In the second method of manufacturing the semiconductor light-emitting device according to an embodiment of the present invention, on the columnar mesa having the side face to which the layer to be oxidized is exposed, the mask layer having the aperture corresponding to the edge of the upper surface and the side face of the mesa, or the vicinity of the edge of the upper surface of the mesa is formed. Then, the edge of the upper surface and the side face of the mesa is selectively etched via the aperture. Thereby, in the case where the aperture of the mask layer is provided on the edge of the upper surface and the side face of the mesa, without largely changing a height of the mesa from its original height, the edge of the upper surface and the side face of the mesa, that is, a region including a portion oxidized from the side face in the layers except the current confinement layer in the vertical cavity structure may be removed. In the case where the aperture of the mask layer is provided corresponding to a vicinity of the edge of the upper surface of the mesa, without largely changing a height of the mesa from its original height, the edge of the upper surface of the mesa, that is, the region including the portion oxidized from the side face in the layers except the current confinement layer in the vertical cavity structure may be separated from the central part of the mesa.

In the first and second methods of manufacturing the semiconductor light-emitting devices according to an embodiment of the present invention, without largely changing a height of the mesa from its original height, the region including a portion oxidized from the side face in the layers except the current confinement layer in the vertical cavity structure is removed or separated. Therefore, the mesa has a height no higher than necessary, and a growth of damage starting from an oxidation front and deformation caused by a volume shrinkage during oxidation may be suppressed in the layers except the current confinement layer in the vertical cavity structure.

Other and further objects, features and advantages of the invention will appear more fully from the following description.

BRIEF DESCRIPTION OF THE DRAWINGS

FIGS. 4A and 4B are a top surface view and a cross-sectional view for explaining a step succeeding FIGS. 3A and 3B, respectively.

FIGS. 9A and 9B are a top surface view and a cross-sectional view for explaining another example of a step of manufacturing the laser diode of FIG. 1, respectively.

FIGS. 14A and 14B are a top surface view and a cross-sectional view for further explaining still another example of a step of manufacturing the laser diode of FIG. 1, respectively.

DETAILED DESCRIPTION OF THE PREFERRED EMBODIMENTS

Preferred embodiments of the present invention will be described in detail with reference to the accompanying drawings.

Figure 1:
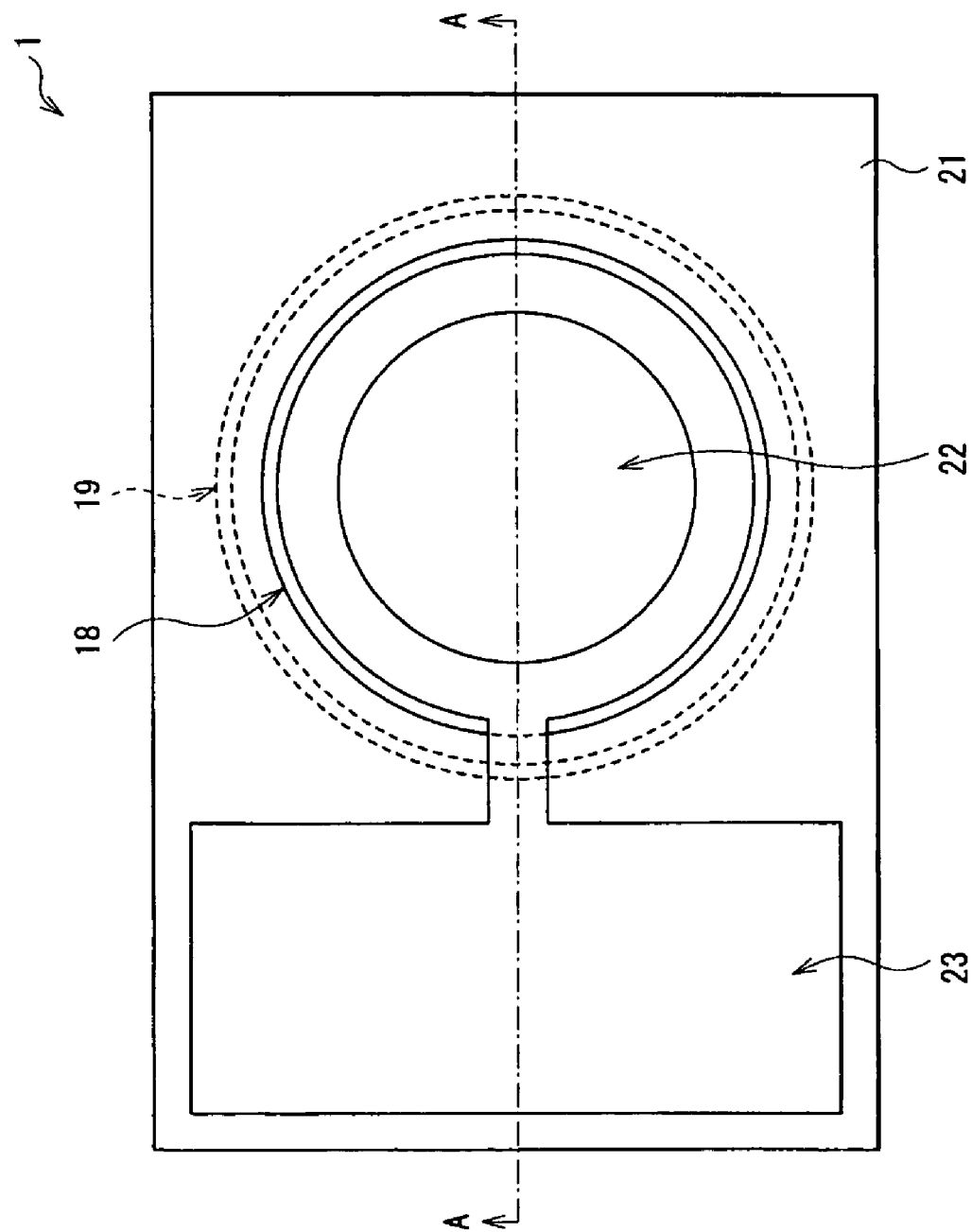
FIG. 1 is a top surface view of a surface-emitting laser diode according to an embodiment of the present invention.
Figure 2:
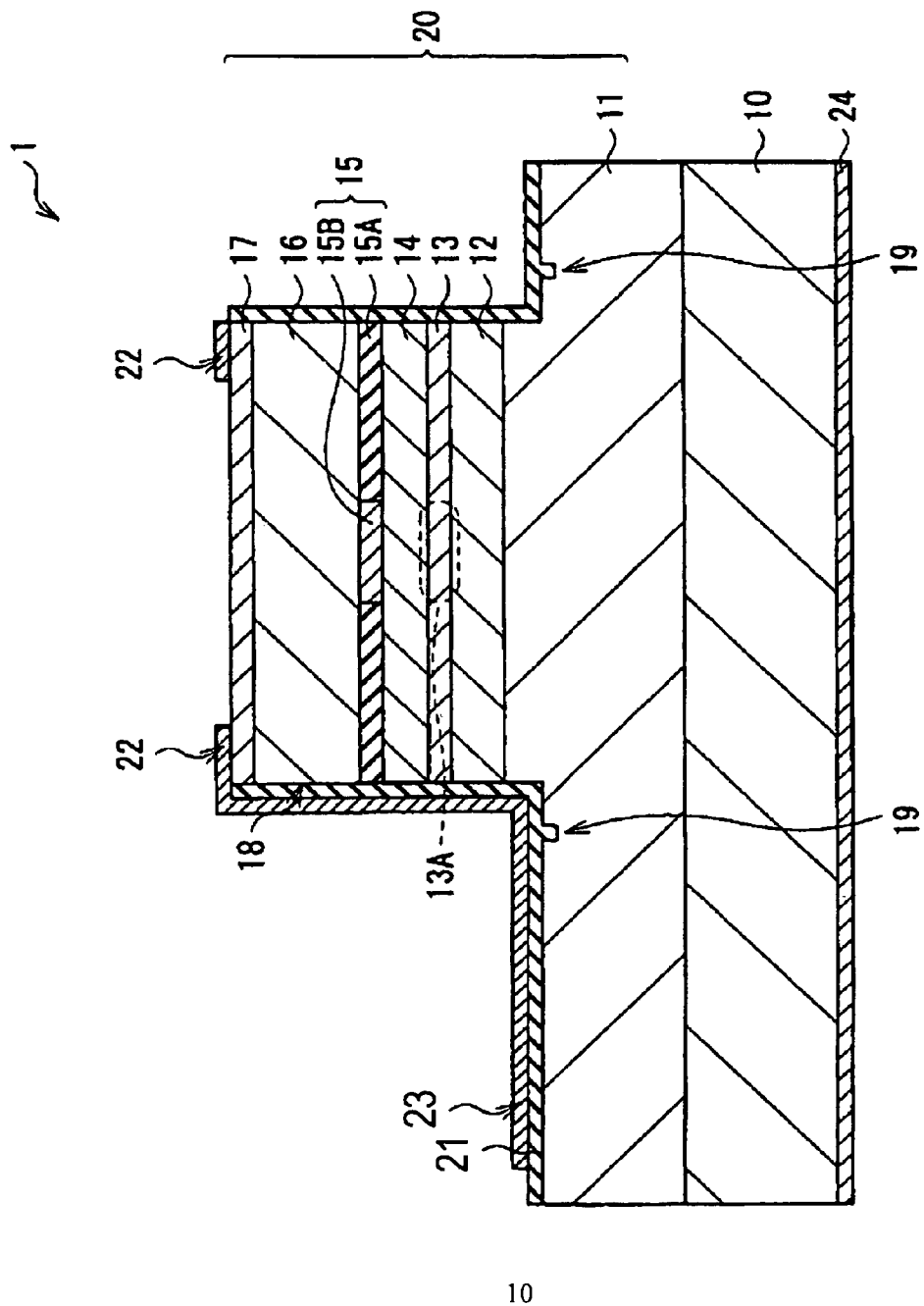
FIG. 2 is a cross-sectional view of the laser diode of FIG. 1.

FIG. 1 illustrates a top surface view of a surface-emitting laser diode 1 according to an embodiment of the present invention. FIG. 2 illustrates a cross-sectional configuration as viewed from the direction of an arrow A-A of FIG. 1.

The laser diode 1 according to the embodiment of the present invention includes a semiconductor stacked structure 20 (a vertical cavity structure) on a surface of a substrate 10. The semiconductor stacked structure 20 is configured by stacking a lower DBR layer 11, a lower spacer layer 12, an active layer 13, an upper spacer layer 14, a current confinement layer 15, an upper DBR layer 16, and a contact layer 17 in this order from the substrate 10 side. A columnar mesa 18 is formed in an upper part of the semiconductor stacked structure 20, specifically, in a part of the lower DBR layer 11, the lower spacer layer 12, the active layer 13, the upper spacer layer 14, the current confinement layer 15, the upper DBR layer 16 and the contact layer 17.

The substrate 10 is, for example, composed of n-type GaAs. The lower DBR layer 11 is configured by alternately stacking a low refractive index layer (not shown in the figure) and a high refractive index layer (not shown in the figure). The low refractive index layer is, for example, composed of n-type $Al_{x1}Ga_{1-x1}As$ ($0<x1<1$) with optical thickness of $\lambda_1/4$ ($\lambda_1$ is an oscillation wavelength). The high refractive index layer is, for example, composed of n-type $Al_{x2}Ga_{1-x2}As$ ($0 \leq x2 < x1$) with optical thickness of $\lambda_1/4$. The lower spacer layer 12 is, for example, composed of n-type $Al_{x3}Ga_{1-x3}As$ ($0 \leq x3 < 1$). The substrate 10, the lower DBR layer 11, and the lower spacer layer 12 include n-type impurities such as silicon (Si) and selenium (Se).

The active layer 13 is, for example, composed of GaAs-type materials. In the active layer 13, a central region (a region facing a current injection region 15B, which will be described later) in a stacked in-plane direction of the active layer 13 becomes a light emitting region 13A.

The upper spacer layer 14 is, for example, composed of p-type $Al_{x4}Ga_{1-x4}As$ ($0 \leq x4 < 1$). The upper DBR layer 16 is configured by alternately stacking the low refractive index layer (not shown in the figure) and the high refractive index layer (not shown in the figure). The low refractive index layer is, for example, composed of p-type $Al_{x5}Ga_{1-x5}As$ ($0<x5<1$) with optical thickness of $\lambda_1/4$. The high refractive index layer is, for example, composed of p-type $Al_{x6}Ga_{1-x6}As$ ($0 \leq x6 < x5$) with optical thickness of $\lambda_1/4$. The contact layer 17 is, for example, composed of p-type $Al_{x7}Ga_{1-x7}As$ ($0 \leq x7 < 1$). The upper spacer layer 14, the upper DBR layer 16, and the contact layer 17 include p-type impurities such as magnesium (Mg).

The current confinement layer 15 includes a current confinement region 15A in a region from a side face of the mesa 18 to a predetermined depth. In the current confinement layer 15, the region (the central region of the mesa 18) except the current confinement region 15A is a current injection region 15B. The current injection region 15B is, for example, composed of p-type $Al_{x8}Ga_{1-x8}As$ ($0<x8 \leq 1$). The current confinement region 15A is, for example, composed of $Al_2O_3$ (aluminum oxide), and is obtained by oxidizing, from the side face of the layer to be oxidized 15D, a highly-concentrated Al included in the layer to be oxidized 15D, as will be described later. Thus, the current confinement layer 15 has a function to confine a current.

The mesa 18 includes the current injection region 15B of the current confinement layer 15, and is formed, for example, in a cylinder shape having a diameter of approximately 40 µm. This diameter is appropriately adjusted according to the oxidation speed and time in the oxidation process so that a non-oxidation region (the current injection region 15B) with a predetermined dimension remains within the mesa 18 in the oxidation process (will be described later).

In the laser diode 1 according to the embodiment of the present invention, a circular groove 19 surrounding the mesa 18 is formed in the surrounding of the mesa 18. The groove 19 is a remnant (a bottom) of when the sidewall of a groove 30 is etched in an after-mentioned manufacturing process. The groove 19 exhibits no specific functions. A protective film 21 is formed on the surface including the groove 19, and on the side face and the central region of the upper surface of the mesa 18. The protective film 21 protects the mesa 18, and is composed of, for example, insulating materials such as silicon oxide ($SiO_2$) and silicon nitride (SiN).

On the upper surface (the upper surface of the contact layer 17) of the mesa 18, a circular upper electrode 22 having an aperture in the region facing the current injection region 15B is provided. On the surface of the protective film 21, an electrode pad 23 for bonding a wire (not shown in the figure) is provided. The electrode pad 23 and the upper electrode 22 are electrically connected to each other. On the rear surface of the substrate 10, a lower electrode 24 is provided. The upper electrode 22 and the electrode pad 23 are configured, for example, by stacking titanium (Ti), platinum (Pt), and gold (Au) in this order, and are electrically connected to the contact layer 17 located in the upper part of the mesa 18. The lower electrode 24 is, for example, configured by stacking alloy of gold (Au) and germanium (Ge), nickel (Ni), and gold (Au) in this order from the substrate 10 side, and is electrically connected to the substrate 10.

The laser diode 1 having such a configuration may be manufactured, as will be described below, for example.

FIGS. 3A and 3B to FIGS. 8A and 8B illustrate steps of manufacturing the laser diode 1 in order. FIGS. 3A, 4A, 5A, 6A, 7A, and 8A illustrate top surface configurations of the device during the manufacturing process. FIGS. 3B, 4B, 5B, 6B, 7B, and 8B show cross-sectional configurations as viewed from the directions of arrows A-A of FIGS. 3A, 4A, 5A, 6A, 7A, and 8A, respectively.

A compound semiconductor layer of GaAs is formed on the substrate 10, for example, by using MOCVD (metal organic chemical vapor deposition) method. For example, materials for the compound semiconductor layer are trimethyl aluminum (TMA) and trimethyl gallium (TMG) and arsine ($A_sH3$). For example, a material for donor impurities is $H_2Se$, and a material for acceptor impurities is dimethyl zinc (DMZ).

First, the semiconductor stacked structure 20D is formed by stacking the lower DBR layer 11, the lower spacer layer 12, the active layer 13, the upper spacer layer 14, the layer to be oxidized 15D (the layer to be the current confinement layer 15 through the after-mentioned oxidation treatment), the upper DBR layer 16, and the contact layer 17 in this order on the substrate 10. Then, a photoresist (not shown in the figure) is formed over the entire upper surface of the contact layer 17.

Figure 3A:
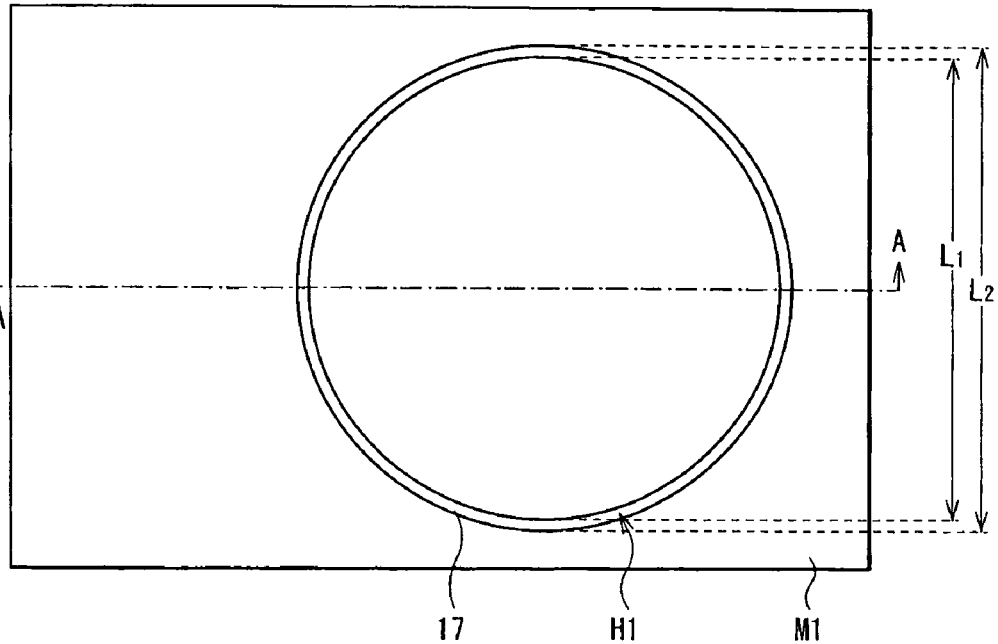
FIGS. 3A and 3B are a top surface view and a cross-sectional view for explaining an example of a step of manufacturing the laser diode of FIG. 1, respectively.
Figure 3B:
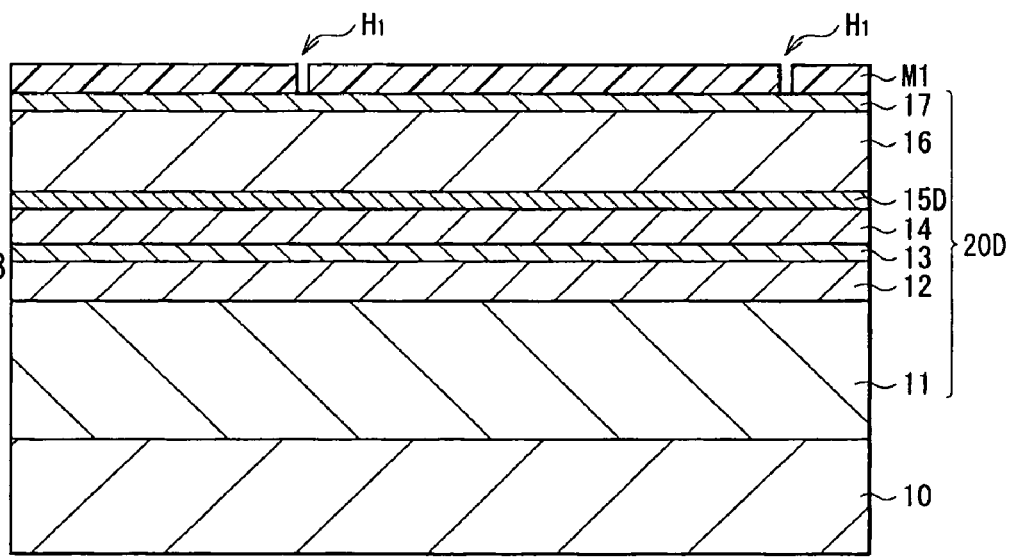
Figure 5A:
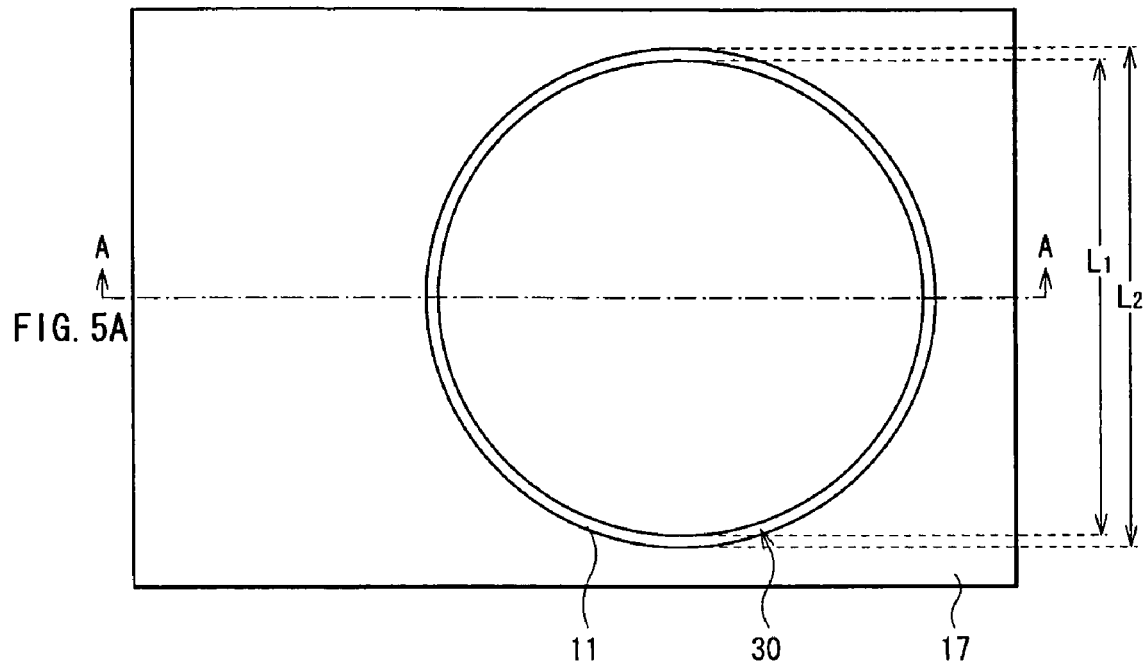
FIGS. 5A and 5B are a top surface view and a cross-sectional view for explaining a step succeeding FIGS. 4A and 4B, respectively.
Figure 5B:
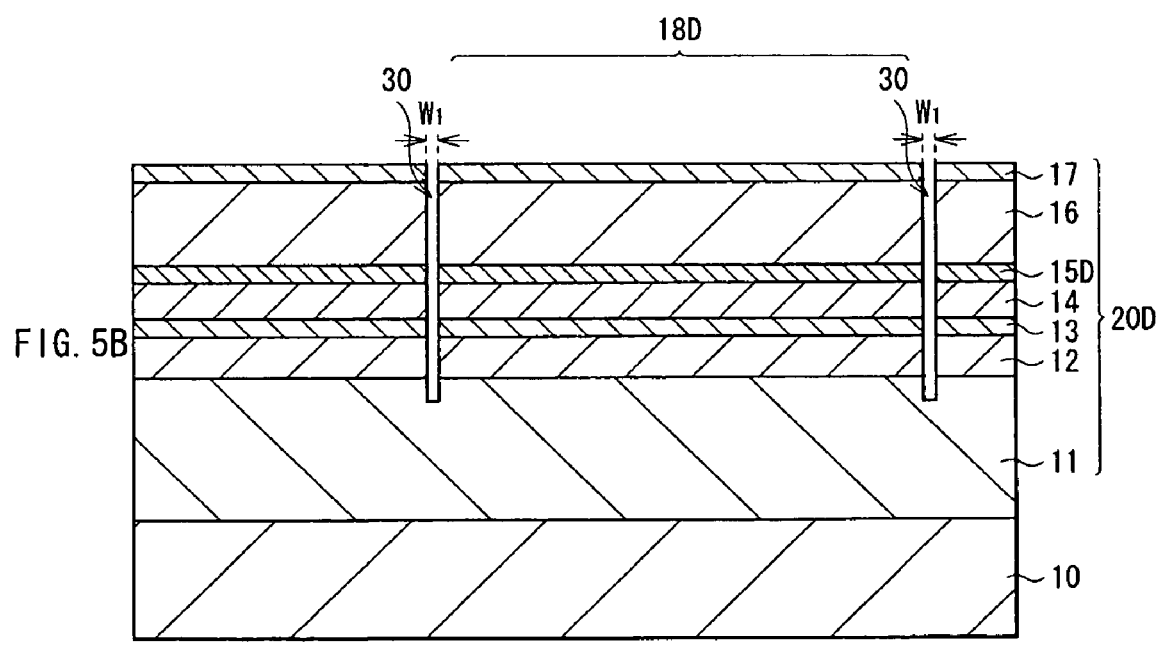

Next, through the photolithography process and the development process, a mask layer M1, for example, having a circular aperture H1 with an inner diameter L1 and an outer diameter L2 (>L1) is formed (FIGS. 3A and 3B). Then, for example by the dry etching method, via the aperture H1, the circular groove 30 having a width W1 (=L2−L1) reaching at least the layer to be oxidized 15D from the upper surface of the semiconductor stacked structure 20D is formed (FIGS. 4A and 4B). Thereby, the columnar mesa 18D having, for example, the diameter equal to the inner diameter L1 of the aperture H1 is formed. The side face of the columnar mesa 18D is surrounded by the groove 30.

The width W1 of the groove 30 is set so that the etching speed of the bottom of the groove 30 becomes slower than the etching speed of the edge of the upper surface and the side face of the mesa 18D, when etching at least the edge of the upper surface and the side face of the mesa 18D in the etching process (will be described later).

Figure 6A:
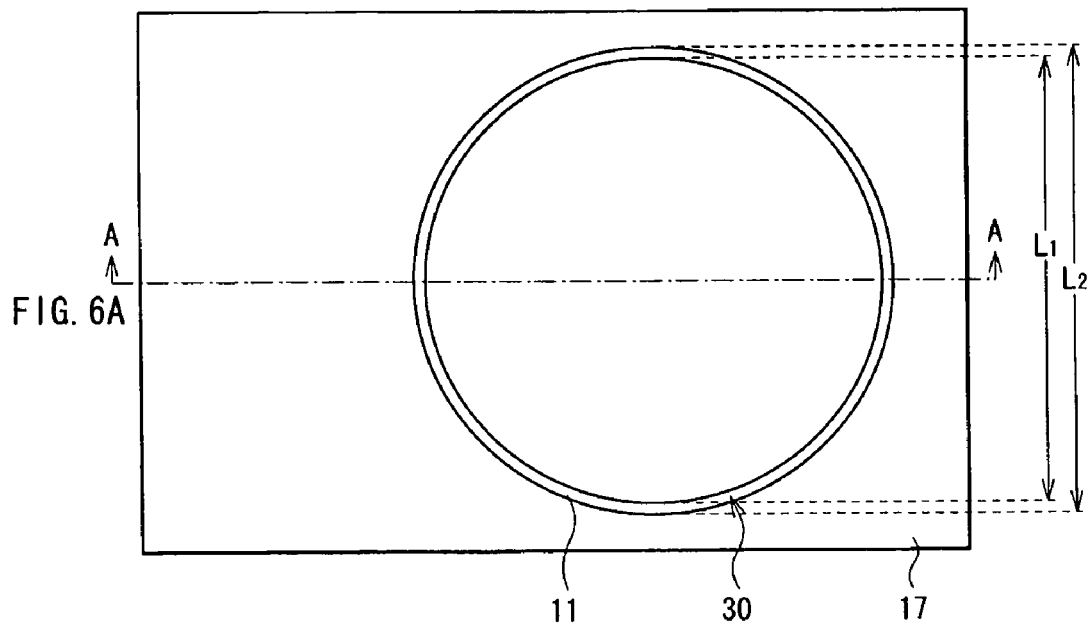
FIGS. 6A and 6B are a top surface view and a cross-sectional view for explaining a step succeeding FIGS. 5A and 5B, respectively.
Figure 6B:
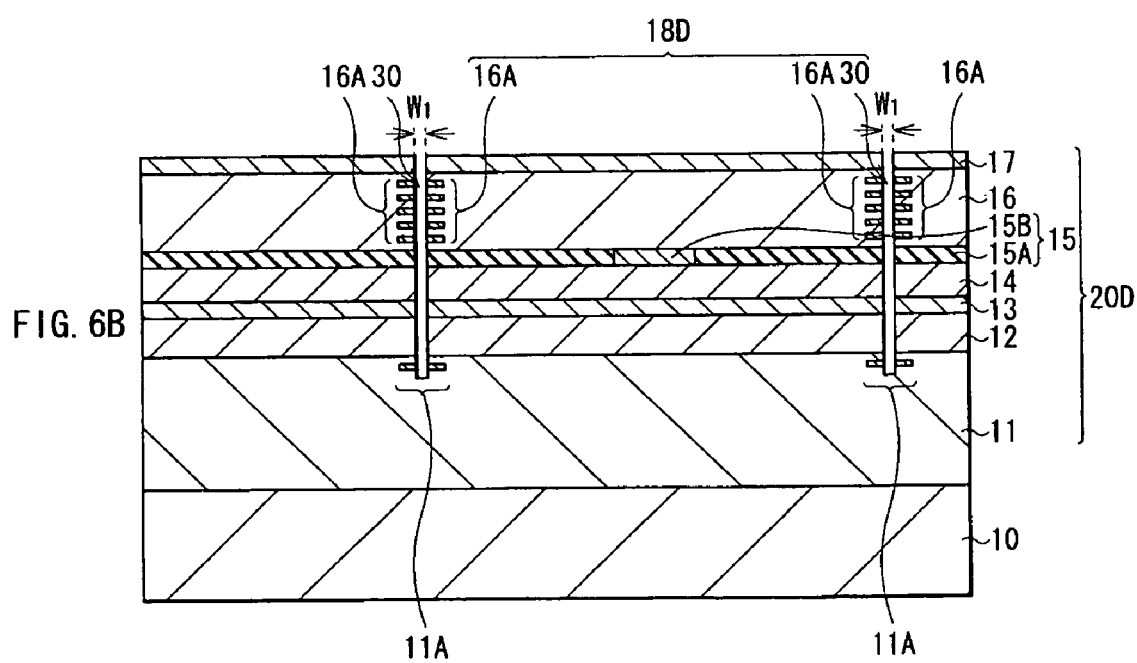

Next, after removing the mask layer M1 (FIGS. 5A and 5B), the layer to be oxidized 15D is selectively oxidized from the side face of the mesa 18D by the high-temperature oxidation treatment in a water-vapor atmosphere (FIGS. 6A and 6B). Thereby, in the layer to be oxidized 15D, a region from the side face to a predetermined depth becomes an oxidation region (an insulating region) containing aluminum oxide, which serves as the current confinement region 15A. A region further deep from the oxidation region becomes a non-oxidation region, which serves as the current injection region 15B. In this manner, the semiconductor stacked structure 20D including the current confinement layer 15 composed of the current confinement region 15A and the current injection region 15B is formed.

Typically, the layer to be oxidized 15D is made of a material, which is most easily oxidized in the semiconductor stacked structure 20D, such as $Al_{0.98}Ga_{0.02}As$ with high Al composition ratio. However, each of the lower DBR layer 11 and the upper DBR layer 16 included in the semiconductor stacked structure 20D generally has a stacked structure by alternately stacking the low refractive index layer of $Al_{0.9}Ga_{0.1}As$ with relatively high Al composition ratio and the high refractive index layer of AlGaAs with relatively low Al composition ratio. The low refractive index layer included in each of the lower DBR layer 11 and the upper DBR layer 16 is oxidized with relative ease.

As described above, in the semiconductor stacked structure 20, there are still other layers except the layer to be oxidized 15D, which are easily oxidized. This causes that, for example, when oxidizing the layer to be oxidized 15D, the low refractive index layer included in each of the lower DBR layer 11 and the upper DBR layer 16 is also slightly oxidized (for example, approximately 2 µm) from its side face to the deeper position. As shown in FIG. 6B, the oxidation portions 11A and 16A are formed on not only the side face (the side face of the inner diameter of the groove 30) of the mesa 18D but also the side face of the outer diameter of the groove 30 facing the side face of the mesa 18D.

Next, the photoresist (not shown in the figure) is formed over the entire surface including the groove 30. Then, through the photolithography process and the development process, the mask having the aperture at least in the region, as viewed from above, facing the oxidation portions 11A and 16A on the mesa structure 18D side is formed. Specifically, the mask is formed so as to expose at least the edge of the upper surface and the side face of the mesa 18D to the external.

Figure 7A:
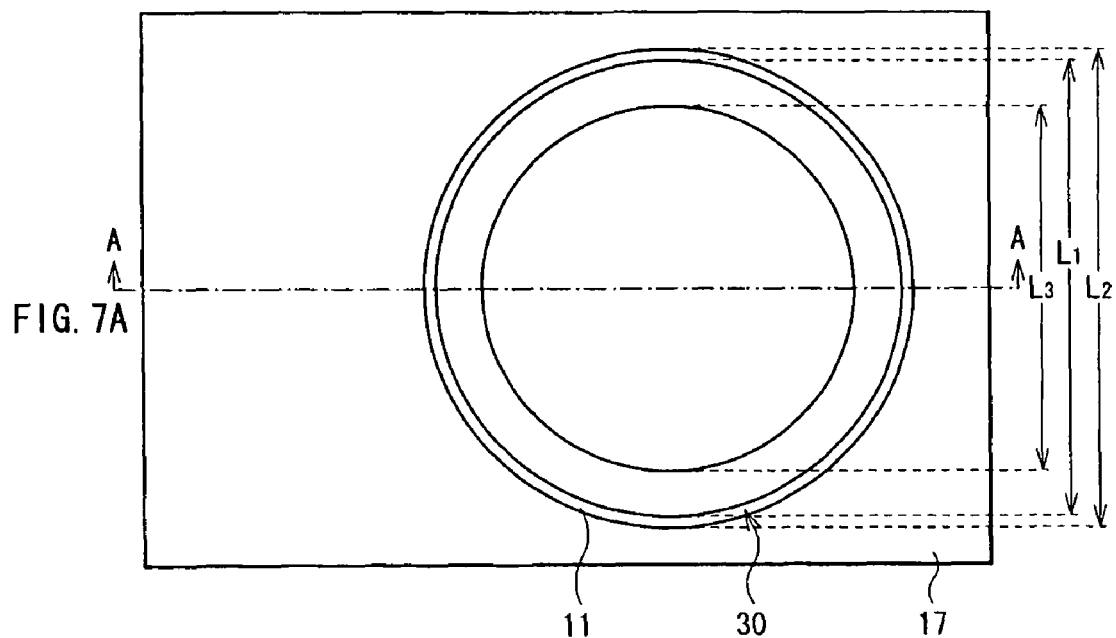
FIGS. 7A and 7B are a top surface view and a cross-sectional view for explaining a step succeeding FIGS. 6A and 6B, respectively.
Figure 7B:
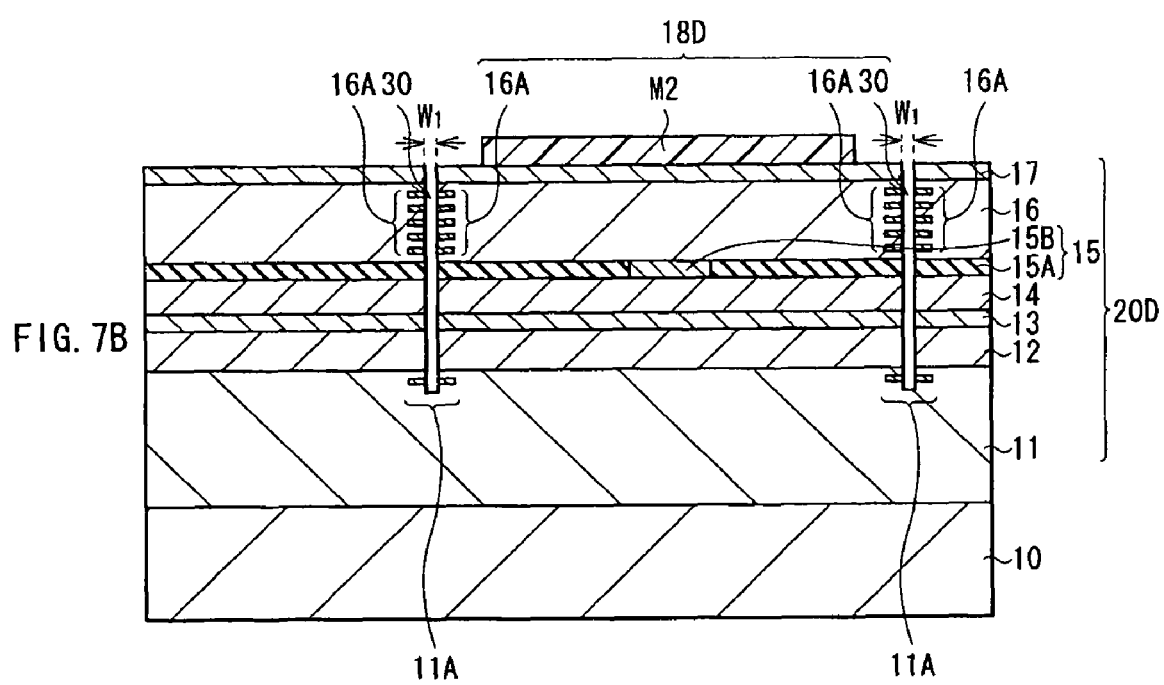

For example, as shown in FIGS. 7A and 7B, formed is a mask layer M2 covering the central region of the upper surface (the region not facing the oxidation portions 11A and 16A in the stacked direction) of the mesa 18D, and exposing the edge of the upper surface (the region facing the oxidation portions 11A and 16A in the stacked direction) and the entire side face of the mesa 18D to the external. The mask layer M2 exposes not only the edge of the upper surface and the entire side face of the mesa 18D but also the bottom and the side face of the outer diameter of the groove 30, and the surrounding of the mesa 18D and the groove 30 in the upper surface of the semiconductor stacked structure 20D to the external. That is, the mask layer M2 is configured by a circular mask having a diameter L3 smaller than the diameter of the mesa 18D, the circular mask disposed in the central region of the upper surface of the mesa 18D.

Figure 8A:
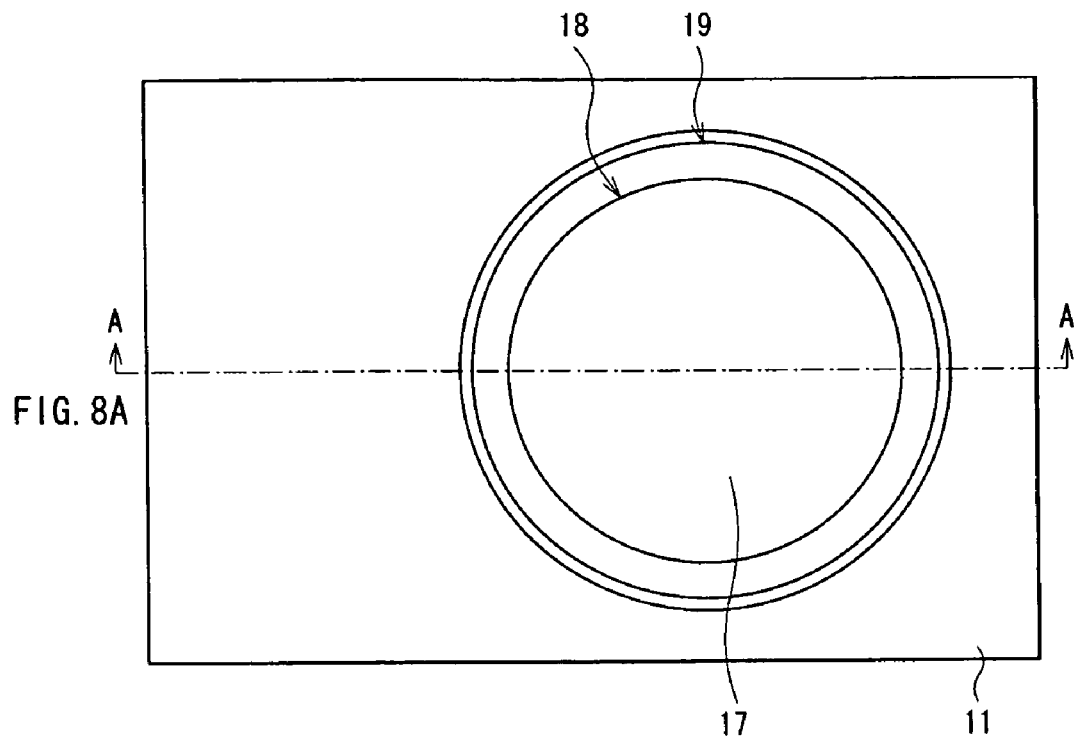
FIGS. 8A and 8B are a top surface view and a cross-sectional view for explaining a step succeeding FIGS. 7A and 7B, respectively.
Figure 8B:
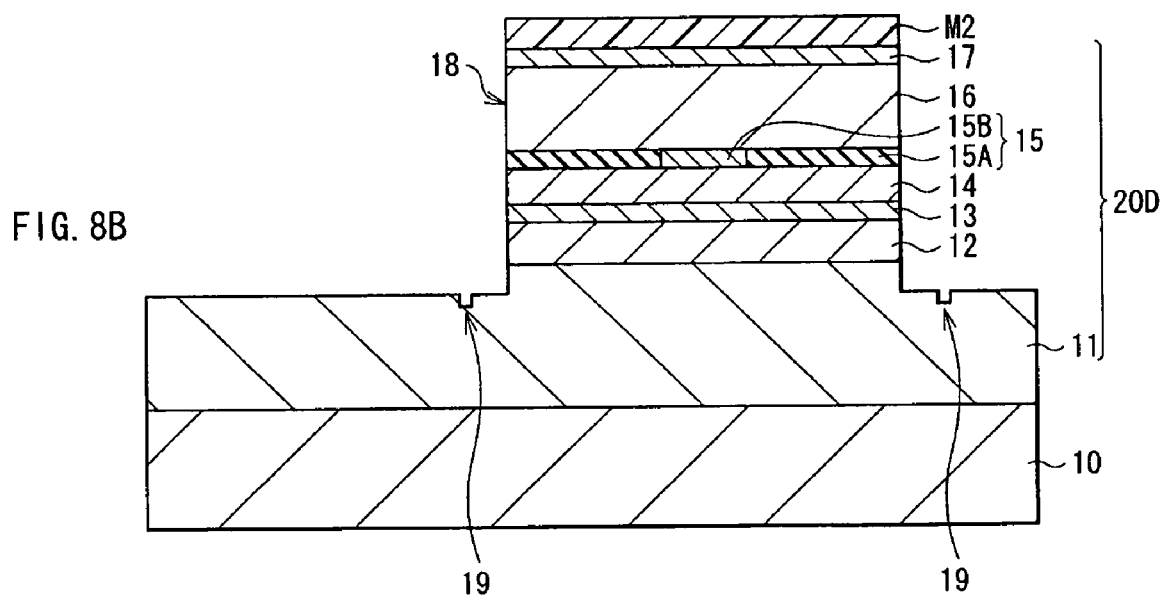

Next, by using the mask layer M2 as a mask, the semiconductor stacked structure 20D is selectively etched, and thereby the columnar mesa 18 having a diameter equal to the diameter L3 of the mask layer M2 is formed and a portion except the mesa 18 in the upper part of the semiconductor stacked structure 20D is selectively removed (FIGS. 8A and 8B). At this time, as described above, because the width W1 of the groove 30 is set so that the etching speed of the bottom of the groove 30 becomes slower than the etching speed of the edge of the upper surface and the side face of the mesa 18D, the height of the mesa 18 is not far different from the height (the depth of the groove 30) of the mesa 18D. As shown in FIGS. 8A and 8B, after etching the side face of the groove 30, the bottom of the groove 30 remains as the circular groove 19 in the surrounding of the mesa 18.

When the mesa 18 is formed by the etching, the etching condition is preferably set so as to form the protective film on the side face of the mesa 18D.

Finally, after removing the mask layer M2, the protective film 21 is formed on the side face and the central region of the upper surface of the mesa 18, and in the surrounding of the mesa 18. The upper electrode 22 is formed on the upper surface (the upper surface of the contact layer 17) of the mesa 18, the electrode pad 23 is formed on the side face and in the surrounding of the mesa 18, and the lower electrode 24 is formed on the rear surface of the substrate 10, respectively (FIGS. 1 and 2). In this manner, the laser diode 1 according to the embodiment of the present invention is manufactured.

Next, the operations and the effects of the laser diode 1 according to the embodiment of the present invention will be described.

In the laser diode 1 according to the embodiment of the present invention, when a predetermined voltage is applied between the electrode pad 23 and the lower electrode 24, the current is injected into the active layer 13 via the current injection region 15B, and thus light emission is generated by a recombination between an electron and a hole. The light is reflected between the pair of the lower DBR layer 11 and the upper DBR layer 16. Then the laser oscillation is produced with a predetermined wavelength and a laser beam is emitted from the aperture of the upper electrode 22 to the external.

In the process of manufacturing the laser diode 1 according to the embodiment of the present invention, when the layer to be oxidized 15D is oxidized from the side face of the mesa 18D, not only the layer to be oxidized 15D but also the low refractive index layer included in each of the lower DBR layer 11 and the upper DBR layer 16 are oxidized from the side face of the mesa 18D. Accordingly, the oxidation portions 11A and 16A are formed in the lower DBR layer 11 and the upper DBR layer 16, respectively (refer to FIG. 6B).

In the oxidation portions 11A and 16A, the deformation caused by the volume shrinkage during the oxidation occurs. Thus, if the oxidation portions 11A and 16A are left in this condition, there is a risk that a mechanical destruction occurs. Further, for example, various impurities such as oxygen are included in an interface (an oxidation front) between the oxidation portions 11A and 16A, and the portion (a non-oxidation portion) except the oxidation portions 11A and 16A in the lower DBR layer 11 and the upper DBR layer 16 so that the oxidation front is in an unstable state. Thus, if the oxidation portions 11A and 16A are left in the condition, damage starting from the oxidation front may grow with time, and there is a risk that a device lifetime is shortened.

However, in the method of manufacturing the laser diode 1 according to the embodiment of the present invention, the circular mask layer M2 having the diameter L3 smaller than the diameter of the mesa 18D surrounded by the groove 30 is disposed in the central region of the upper surface of the mesa 18D, and the semiconductor stacked structure 20D is selectively etched by using the mask layer M2 as a mask. Thus, the columnar mesa 18 having the diameter equal to the diameter L3 of the mask layer M2 is formed, and the portion (including the oxidation portions 11A and 16A) except the mesa 18 in the upper part of the semiconductor stacked structure 20D is selectively removed. Therefore, the mesa 18 may have the height no higher than necessary, and the growth of the damage starting from the oxidation front and the deformation caused by the volume shrinkage during the oxidation may be suppressed afterwards, in the layers (especially the lower DBR layer 11 and the upper DBR layer 16) except the current confinement layer 15 in the semiconductor stacked structure 20. As a result, the reliability is improved.

In the method of manufacturing the laser diode 1, when the mesa 18 is formed by the etching, in the case where the etching condition is set so as to form the protective film on the side face of the mesa 18D, the time when the side face of each of the lower DBR layer 11 and the upper DBR layer 16 is exposed to the external may be shortened. Therefore, the reliability may be further improved.

Modification

In the embodiment, as shown in FIGS. 7A, 7B, 8A, and 8B, the circular mask layer M2 having the diameter L3 smaller than the diameter of the mesa 18D is disposed in the central region of the upper surface of the mesa 18D, and then the semiconductor stacked structure 20D is selectively etched. Alternatively, for example as shown in FIGS. 9A and 9B, a mask layer M3 covering not only the central region of the upper surface of the mesa 18D but also the surrounding of the mesa 18D in the upper surface of a semiconductor stacked structure 20D may be formed on the semiconductor stacked structure 20D, and then the semiconductor stacked structure 20D is selectively etched. In this case, at least the edge of the upper surface and the side face of the mesa 18D and the bottom of the groove 30 are exposed from the mask layer M3 so that the oxidation portions 11A and 16A may be removed from the mesa 18D. Thus, the mesa 18 may have the height no higher than necessary, and the growth of the damage starting from the oxidation front and the deformation caused by the volume shrinkage during the oxidation may be suppressed.

Figure 10A:
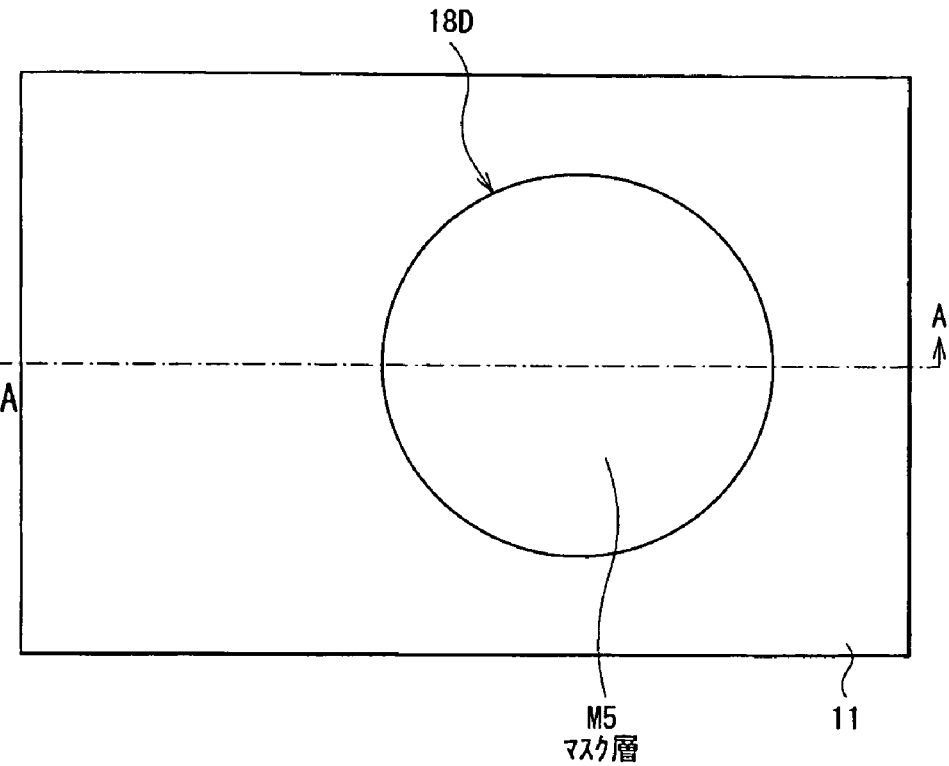
FIGS. 10A and 10B are a top surface view and a cross-sectional view for explaining still another example of a step of manufacturing the laser diode of FIG. 1, respectively.
Figure 10B:
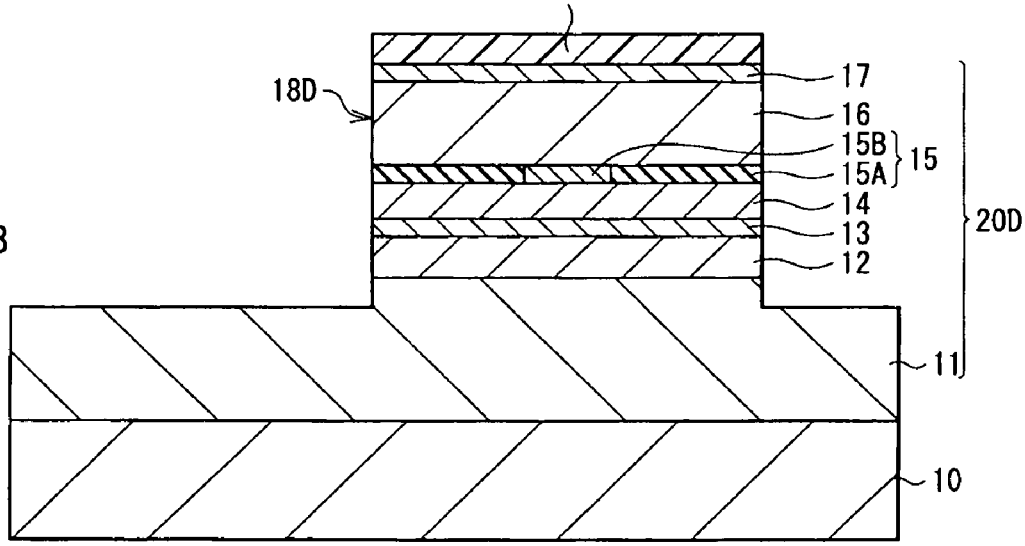

In the embodiment, the circular groove 30 is formed in the upper part of the semiconductor stacked structure 20D so as to form the mesa 18D. However, it is also possible that, for example, a circular mask layer M5 is formed in the region corresponding to the region of the upper surface of the semiconductor stacked structure 20D, where the mesa 18D is to be formed, and then the semiconductor stacked layer 20D is selectively etched so as to form the mesa 18D (refer to FIGS. 10A and 10B).

In this case, however, succeeding steps are necessary as will be described below.

Figure 11A:
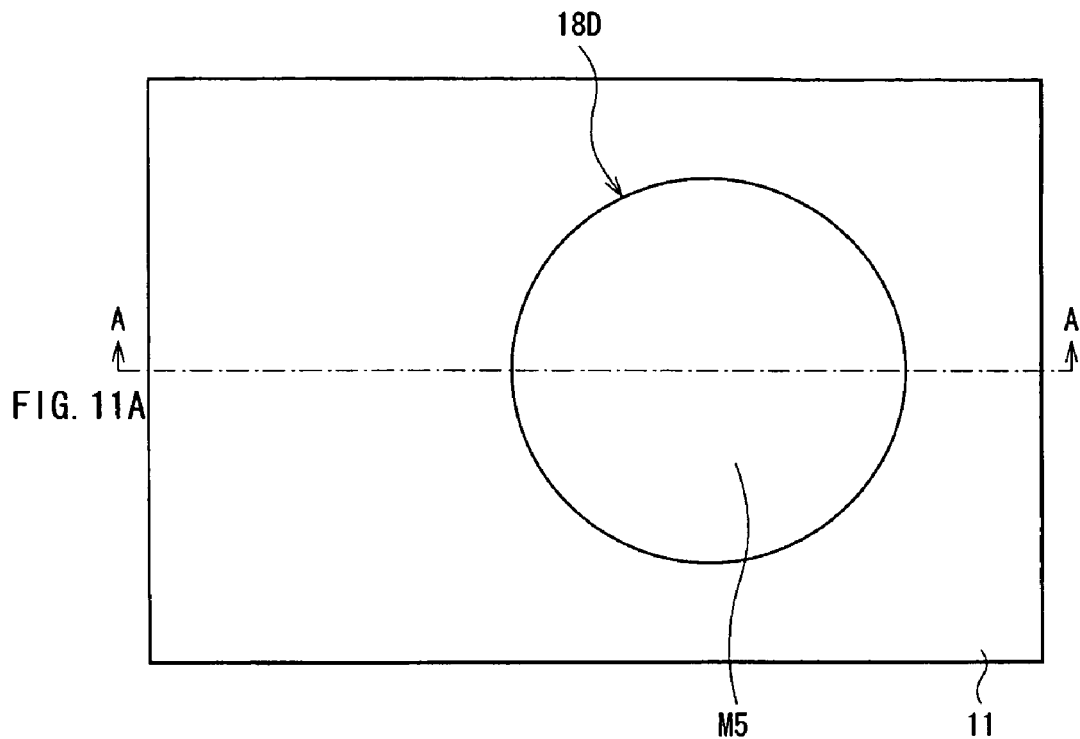
FIGS. 11A and 11B are a top surface view and a cross-sectional view for explaining a step succeeding FIGS. 10A and 10B, respectively.
Figure 11B:
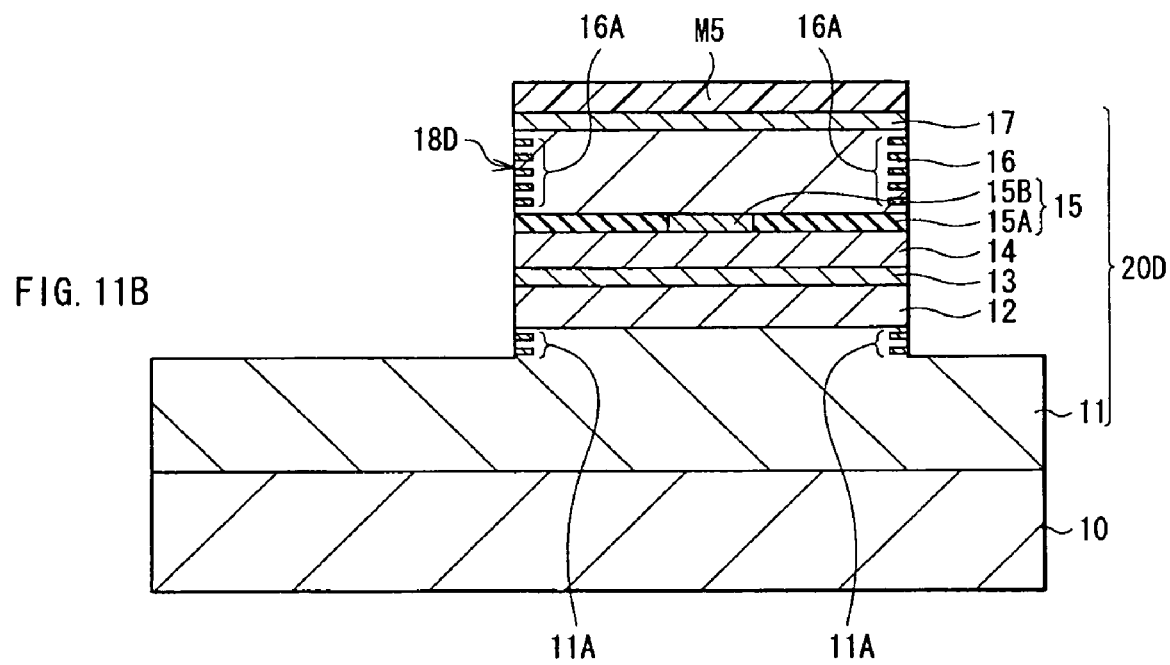
Figure 12A:
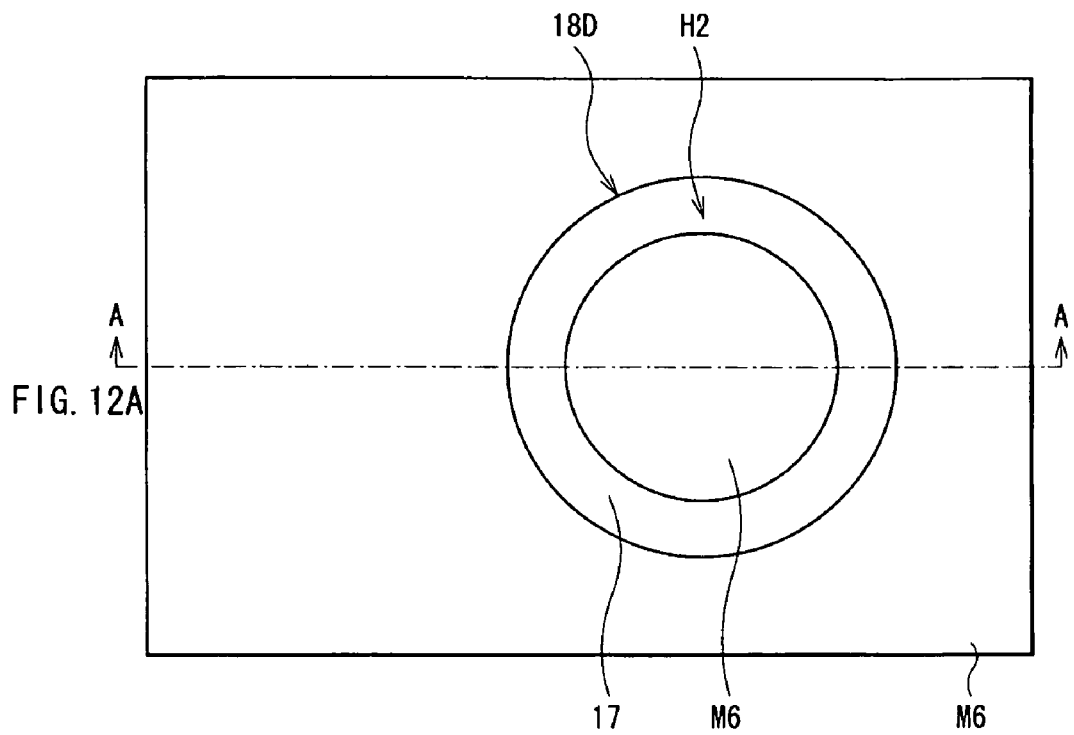
FIGS. 12A and 12B are a top surface view and a cross-sectional view for explaining a step succeeding FIGS. 11A and 11B, respectively.
Figure 12B:
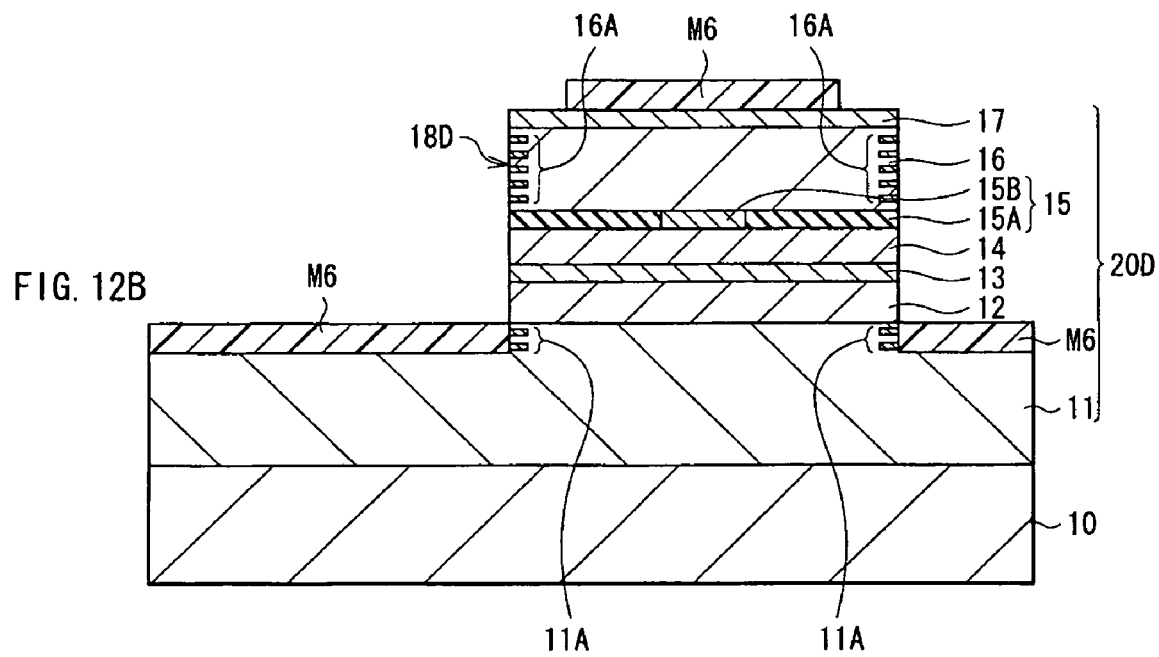
Figure 13A:
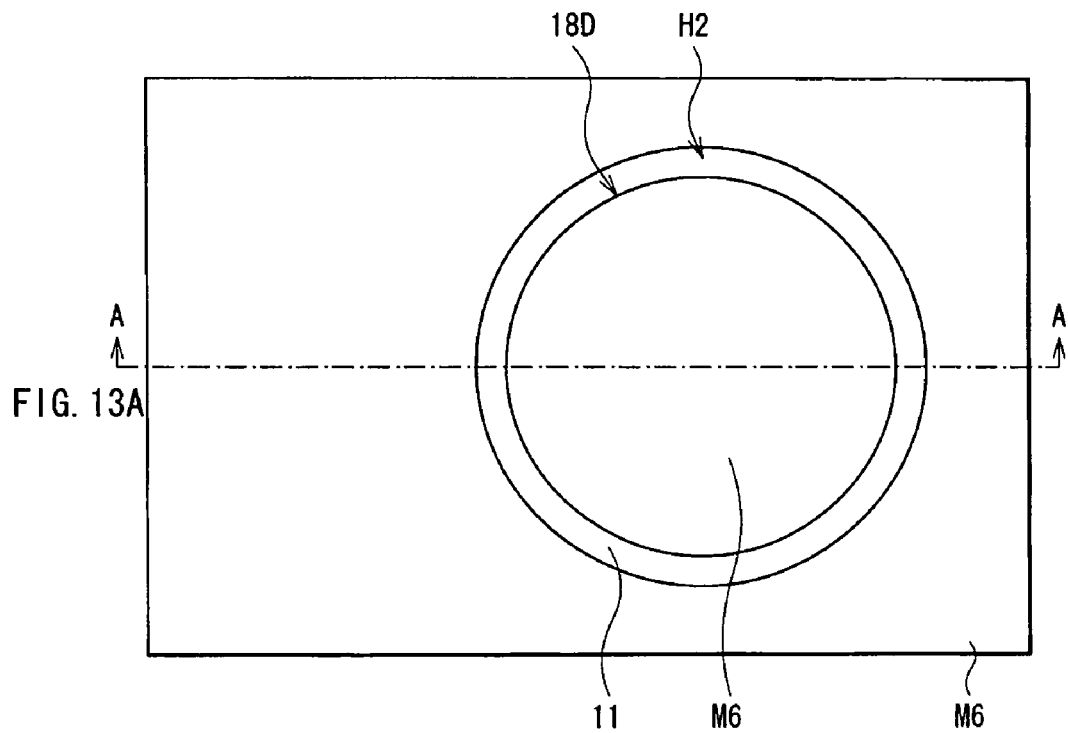
FIGS. 13A and 13B are a top surface view and a cross-sectional view for explaining a step succeeding FIGS. 12A and 12B, respectively.
Figure 13B:
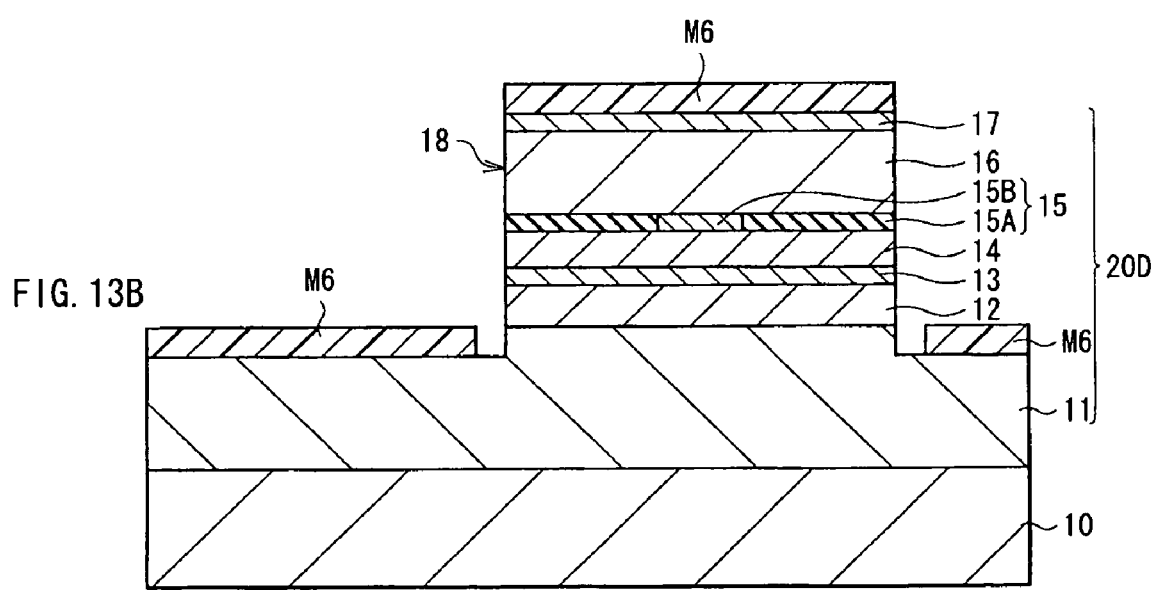

For example, the layer to be oxidized 15D is oxidized from the side face of the mesa 18D, thereby forming the current confinement layer 15 (FIGS. 11A and 11B). Then, a circular mask layer M6 having an aperture H2 corresponding to the edge of the upper surface and the side face of the mesa 18D is formed (FIGS. 12A and 12B). The edge of the upper surface and the side face of the mesa 18D is selectively etched via the aperture H2 so that the oxidation portions 11A and 16A are removed from the mesa 18D (FIGS. 13A and 13B).

Figure 15A:
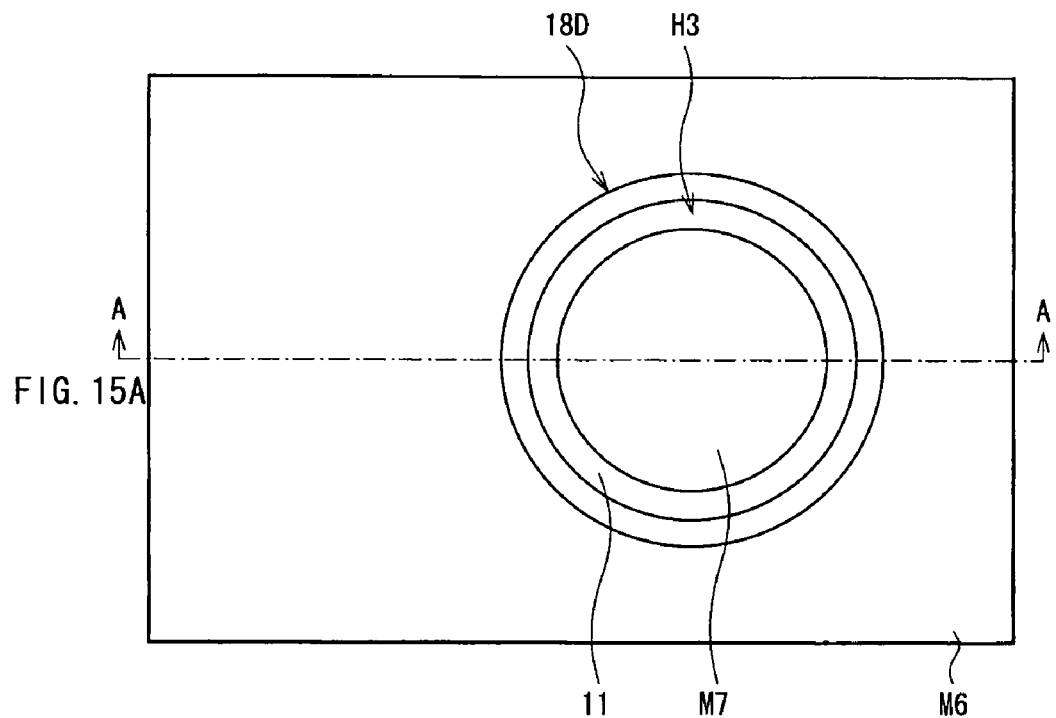
FIGS. 15A and 15B are a top surface view and a cross-sectional view for explaining a step succeeding FIGS. 14A and 14B, respectively.
Figure 15B:
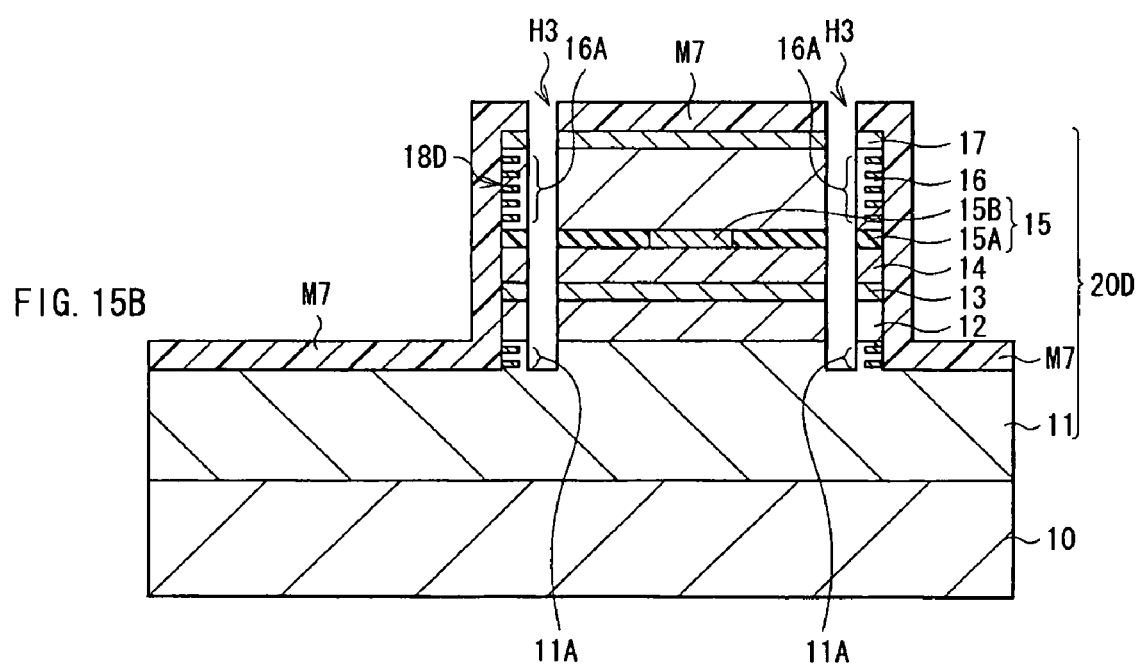
Figure 16:
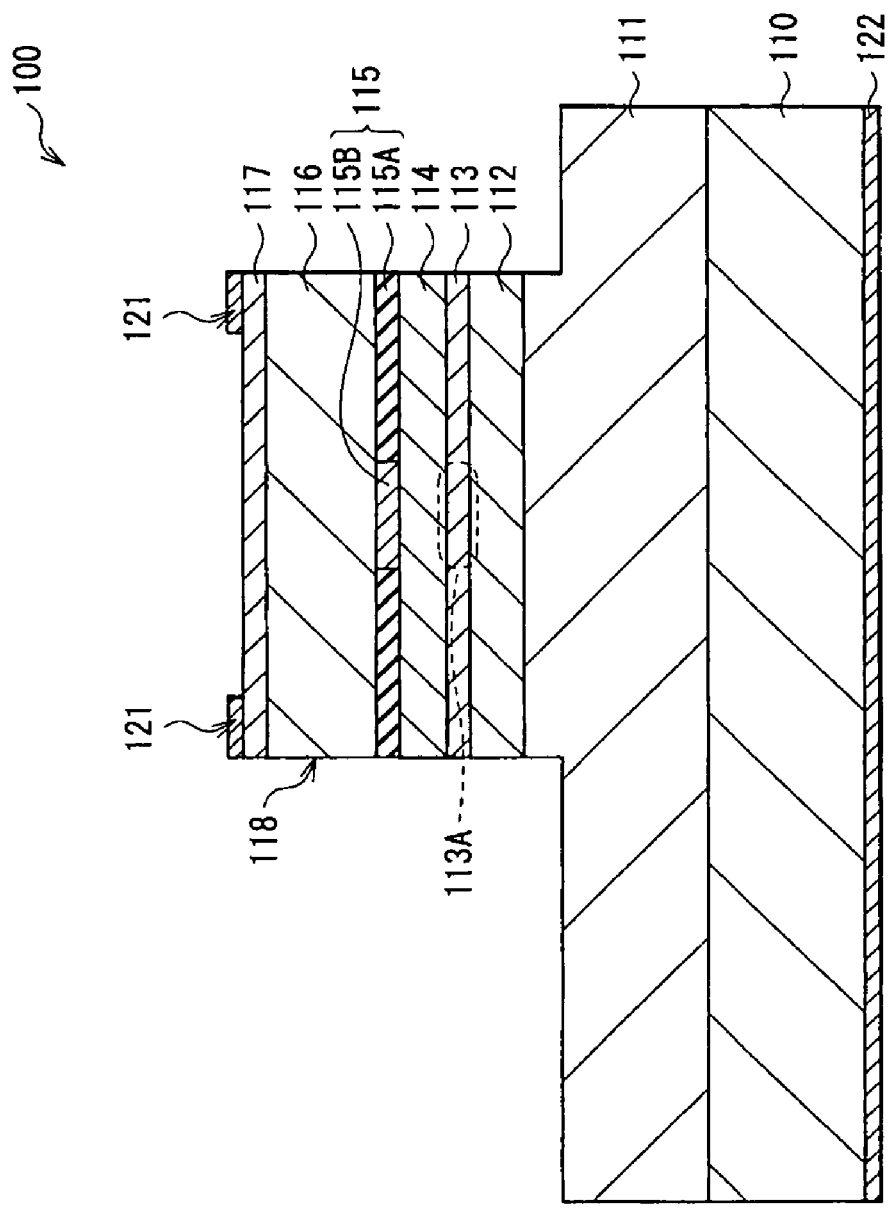
FIG. 16 is a cross-sectional view of an example of a surface-emitting laser diode of the related art.
Figure 17:
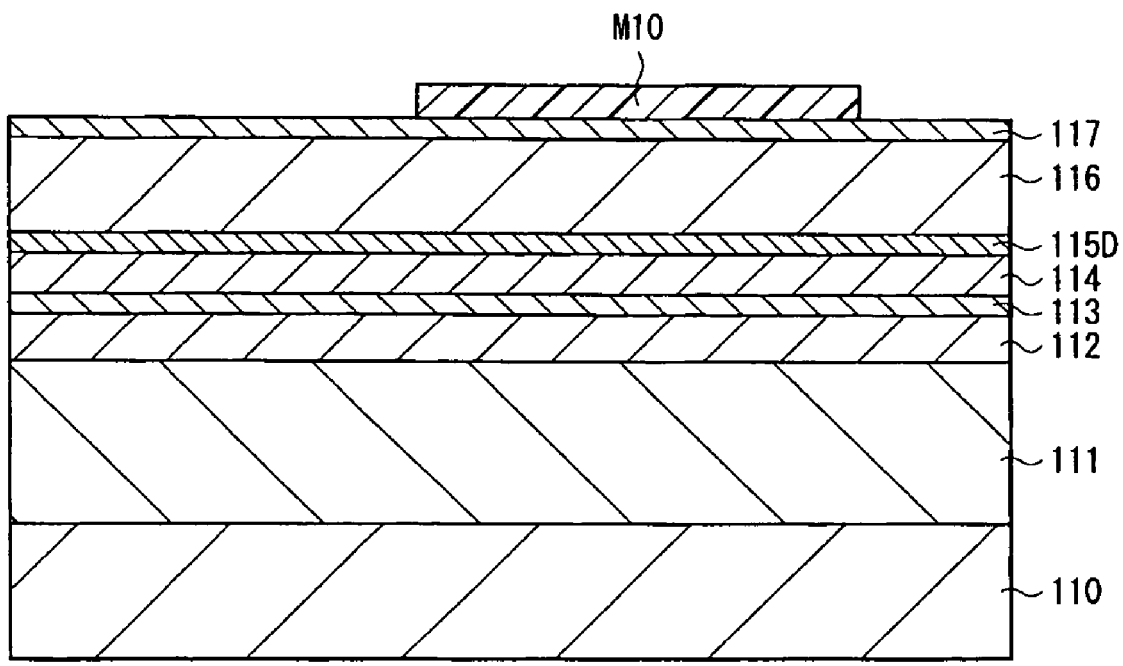
FIG. 17 is a cross-sectional view for explaining an example of a step of manufacturing the laser diode of FIG. 16.
Figure 18:
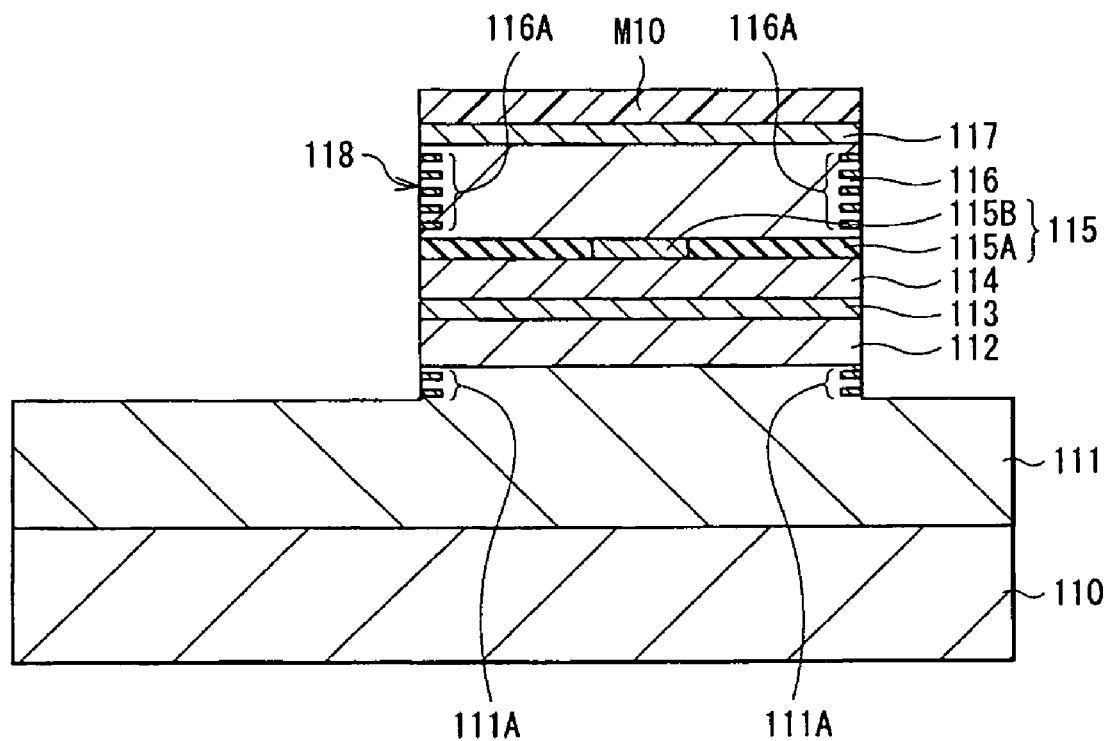
FIG. 18 is a cross-sectional view for explaining a step succeeding FIG. 17.
Figure 19:
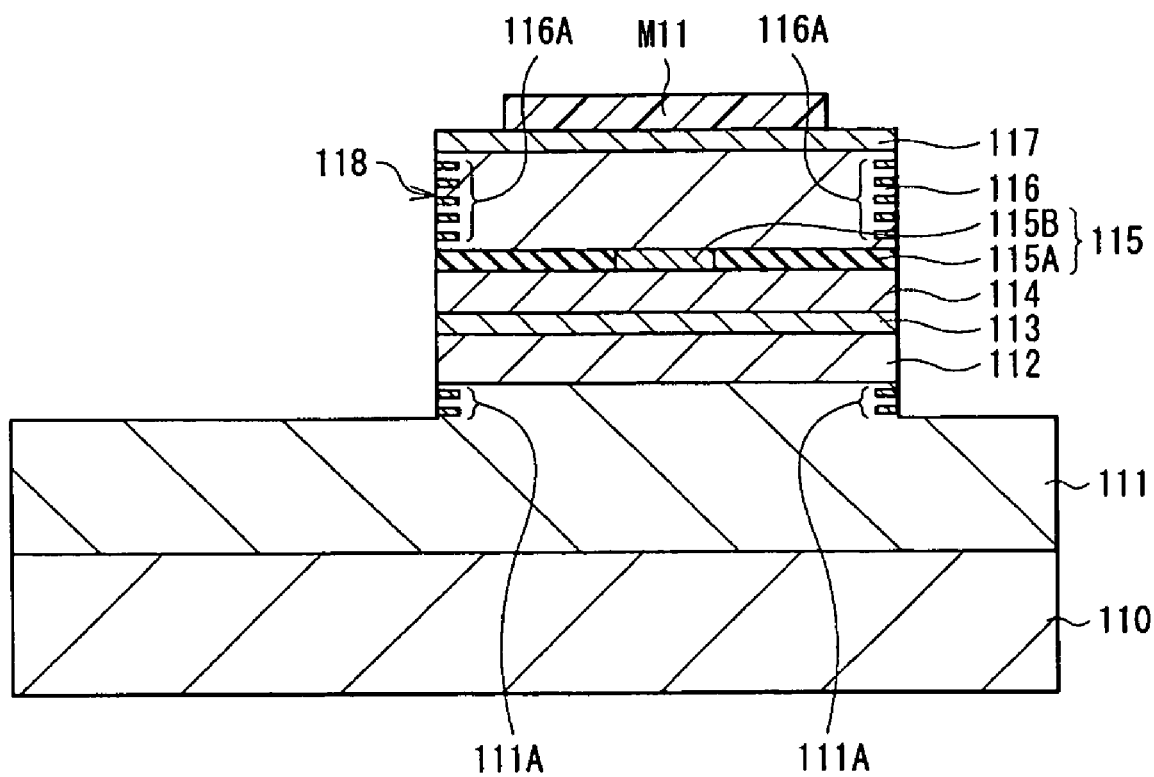
FIG. 19 is a cross-sectional view for explaining another example of a step of manufacturing the laser diode of FIG. 18.

Alternatively, for example, the layer to be oxidized 15D is oxidized from the side face of the mesa 18D, thereby forming the current confinement layer 15 (FIGS. 11A and 11B). Then, a circular mask layer M7 having an aperture H3 corresponding to a vicinity of the edge of the upper surface of the mesa 18D is formed (FIGS. 14A and 14B). The vicinity of the edge of the upper surface of the mesa 18D is selectively etched via the aperture H3 so that the oxidation portions 11A and 16A are separated from the mesa 18D (FIGS. 15A and 15B).

As described above, by also using these alternative methods, the mesa 18 having the height no higher than necessary may be obtained, and the growth of the damage starting from the oxidation front and the deformation caused by the volume shrinkage during the oxidation may be suppressed. However, when using these methods, the precision to align the position of the apertures H2 and H3 and the position of the mesa 18D is desired.

Although the present invention is described with the embodiment and the modification, the present invention is not limited to those as various modifications are available.

For example, in the embodiment, the present invention is described with an example of AlGaAs-type compound laser diode. However, the present invention is also applicable to other compound laser diodes such as GaInP-type, AlGaInP-type, InGaAs-type, GaInP-type, InP-type, GaN-type, GaInN-type, and GaInNAs type compound laser diodes.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a semiconductor light-emitting device, the method comprising steps of:
    forming a groove in a vertical cavity structure, said groove exposing a side face of said vertical cavity structure, and thereafter;

oxidizing said side face of said vertical cavity structure to form a current confinement region, said current confinement region being a portion of a current confinement layer, and thereafter;

removing said side face of said vertical cavity structure to expose another side face of said vertical cavity structure, wherein a width of said groove is set so that an etching speed of a bottom of said groove becomes slower than an etching speed of the edge of an upper surface and said side face of said vertical cavity structure.

2. The method according to claim 1, wherein a portion of said current confinement region is removed during the step of removing the side face.

3. The method according to claim 1, wherein a protective film is formed on said another side face of said vertical cavity structure.

4. The method according to claim 1, wherein during the step of oxidizing the side face, said portion of said current confinement layer is oxidized to form said current confinement region, a non-oxidized portion of said current confinement layer being a current injection region.

5. The method according to claim 4, wherein said vertical cavity structure includes:

an upper DBR layer between a contact layer and said current confinement layer, an upper spacer layer between said current confinement layer and an active layer, and a lower spacer layer between said active layer and a lower DBR layer.

6. The method according to claim 5, wherein a portion of said contact layer is removed during the step of removing the side face.

7. The method according to claim 5, wherein a portion of said upper DBR layer is removed during the step of removing the side face.

8. The method according to claim 5, wherein a portion of said upper spacer layer is removed during the step of removing the side face.

9. The method according to claim 5, wherein a portion of said active layer is removed during the step of removing the side face.

10. The method according to claim 5, wherein a portion of said lower spacer layer is removed during the step of removing the side face.

11. The method according to claim 5, wherein a portion of said lower DBR layer is removed during the step of removing the side face.

12. The method according to claim 1, wherein said groove surrounds said side face of said vertical cavity structure.

13. The method according to claim 1, wherein said vertical cavity structure is on a substrate.

* * * * *